(12) United States Patent
Matsushita

(10) Patent No.: US 11,968,786 B2
(45) Date of Patent: Apr. 23, 2024

(54) COMPONENT REPLENISHMENT MANAGEMENT SYSTEM AND COMPONENT MOUNTING SYSTEM

(71) Applicant: YAMAHA HATSUDOKI KABUSHIKI KAISHA, Iwata (JP)

(72) Inventor: Yoichi Matsushita, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 832 days.

(21) Appl. No.: 17/051,827

(22) PCT Filed: May 30, 2018

(86) PCT No.: PCT/JP2018/020795
§ 371 (c)(1),
(2) Date: Oct. 30, 2020

(87) PCT Pub. No.: WO2019/229882
PCT Pub. Date: Dec. 5, 2019

(65) Prior Publication Data
US 2021/0127534 A1    Apr. 29, 2021

(51) Int. Cl.
*H05K 13/08* (2006.01)
*G06Q 10/047* (2023.01)
(Continued)

(52) U.S. Cl.
CPC ......... *H05K 13/086* (2018.08); *G06Q 10/047* (2013.01); *G06Q 10/087* (2013.01); *H05K 13/0495* (2013.01)

(58) Field of Classification Search
CPC .................. H05K 13/0495; H05K 13/086
See application file for complete search history.

(56) References Cited

U.S. PATENT DOCUMENTS

2006/0229758 A1   10/2006 Maenishi et al.
2007/0294875 A1   12/2007 Hachiya et al.
(Continued)

FOREIGN PATENT DOCUMENTS

CN   1778157 A    5/2006
CN   1846223 A   10/2006
(Continued)

OTHER PUBLICATIONS

International Search Report issued in PCT/JP2018/020795; dated Aug. 21, 2018.

*Primary Examiner* — Vincent H Tran
(74) *Attorney, Agent, or Firm* — Studebaker & Brackett PC

(57) ABSTRACT

A component replenishment management system includes an emergency device extraction unit, an emergency time setting unit, a replenishable device identification unit, and a replenishment target extraction unit. The emergency device extraction unit extracts, as first and second emergency devices, top two component supply devices having highest degree of emergency for performing the component replenishment work. The emergency time setting unit sets an emergency time zone from a first emergency time for the component replenishment work for the first emergency device to a second emergency time for the component replenishment work for the second emergency device. The replenishable device identification unit identifies, as a replenishable device, a component supply device that can be replenished with a component storage member. The replenishment target extraction unit extracts a replenishment target device that is a target of the component replenishment work within a range of the emergency time zone among the replenishable devices.

13 Claims, 17 Drawing Sheets

COMPONENT SUPPLY MONITORING INFORMATION JH4

| COMPONENT MOUNTING LINE NAME (J41) | MOUNTER TYPE (J11) | WORK AREA (J42) | COMPONENT SUPPLY DEVICE — SET POSITION (J12) | COMPONENT SUPPLY DEVICE — DEVICE TYPE | REPLENISHABLE TIME TT (J43) | COMPONENT REPLENISHMENT TIME LIMIT WT (J44) | WORK STANDARD TIME WS (J45) |
|---|---|---|---|---|---|---|---|
| 2L1 | 2A1 | WA1 | S11 | AF | TTA1 | WTA1 | WSA1 |
| 2L1 | 2B1 | WA1 | S11 | AF | TTB1 | WTB1 | WSB1 |
| ... | ... | ... | ... | ... | ... | ... | ... |

(51) Int. Cl.
G06Q 10/087 (2023.01)
H05K 13/04 (2006.01)

(56) References Cited

U.S. PATENT DOCUMENTS

| | | |
|---|---|---|
| 2010/0180434 A1 | 7/2010 | Moriya |
| 2011/0302776 A1 | 12/2011 | Kato et al. |
| 2012/0311854 A1 | 12/2012 | Yamauchi et al. |
| 2015/0212503 A1 | 7/2015 | Shimizu et al. |
| 2016/0170407 A1 | 6/2016 | Nakazono et al. |
| 2016/0353621 A1 | 12/2016 | Maezono et al. |
| 2016/0360657 A1 | 12/2016 | Oyama |
| 2017/0020041 A1 | 1/2017 | Iwase et al. |
| 2017/0061365 A1 | 3/2017 | Nonoyama |
| 2017/0308832 A1 | 10/2017 | Takehara et al. |
| 2017/0354070 A1 | 12/2017 | Kobayashi et al. |
| 2018/0011717 A1 | 1/2018 | Iisaka |
| 2018/0064005 A1 | 3/2018 | Iisaka |
| 2018/0084684 A1 | 3/2018 | Ohashi et al. |
| 2018/0101161 A1 | 4/2018 | Yasui et al. |
| 2018/0124961 A1 | 5/2018 | Nagaishi |
| 2019/0090394 A1 | 3/2019 | Ishikawa |
| 2019/0313558 A1* | 10/2019 | Shimizu ............ G05B 13/042 |
| 2020/0170154 A1 | 5/2020 | Sugihara |
| 2020/0404818 A1* | 12/2020 | Matsushita ........ H05K 13/0417 |
| 2021/0111977 A1* | 4/2021 | Watanabe ........... G06F 11/3013 |

FOREIGN PATENT DOCUMENTS

| | | | | |
|---|---|---|---|---|
| CN | 102771204 A | 11/2012 | | |
| CN | 104429174 A | 3/2015 | | |
| CN | 105704996 A | 6/2016 | | |
| CN | 106030769 A | 10/2016 | | |
| CN | 106105416 A | 11/2016 | | |
| CN | 106233827 A | 12/2016 | | |
| CN | 107211561 A | 9/2017 | | |
| CN | 107211565 A | 9/2017 | | |
| CN | 107318257 A | 11/2017 | | |
| CN | 107409491 A | 11/2017 | | |
| CN | 107432119 A | 12/2017 | | |
| EP | 2 874 481 A1 | 5/2015 | | |
| IN | 101107899 A | 1/2008 | | |
| JP | 2005209919 A | 8/2005 | | |
| JP | 2006210647 A | 8/2006 | | |
| JP | 2012028660 A | 2/2012 | | |
| JP | 2013175617 A | 9/2013 | | |
| JP | 2016115739 A | * | 6/2016 | ....... G05B 19/41865 |
| JP | 2016225385 A | 12/2016 | | |
| WO | 2004103052 A1 | 11/2004 | | |
| WO | WO-2015079497 A1 | * | 6/2015 | ........... H05K 13/021 |
| WO | 2017/168638 A1 | 10/2017 | | |
| WO | 2017/208325 A1 | 12/2017 | | |
| WO | 2017208287 A1 | 12/2017 | | |

* cited by examiner

FIG. 8

ATTACHMENT INFORMATION JH1

| MOUNTER TYPE (J11) | COMPONENT SUPPLY DEVICE | | COMPONENT TYPE (J14) | PRECEDING COMPONENT REMAINING NUMBER (J15) | TOTAL COMPONENT REMAINING NUMBER (J16) | COMPONENT REMAINING NUMBER WARNING VALUE (J17) | COMPONENT REMAINING NUMBER STOP VALUE (J18) |
|---|---|---|---|---|---|---|---|
| | SET POSITION (J12) | DEVICE TYPE (J13) | | | | | |
| 2A1 | S11 | AF | P11 | NA1 | NA11 | NS11 | NS11 |
| | S12 | AF | P12 | NA2 | NA12 | NS12 | NS12 |
| | S13 | AF | P13 | NA3 | NA13 | NS13 | NS13 |
| | ... | ... | ... | ... | ... | ... | ... |

FIG. 10

PRODUCTION PLAN INFORMATION JH2

| PRODUCTION ORDER (J21) | SUBSTRATE TYPE (J22) | PRODUCTION QUANTITY (J23) | CYCLE TIME (SECOND/SHEET) (J24) |
|---|---|---|---|
| 1 | SUBSTRATE A | AA | CTA |
| 2 | SUBSTRATE B | BB | CTB |
| ... | ... | ... | ... |

SUBSTRATE INFORMATION JH3

| SUBSTRATE TYPE (J22) | SET POSITION (J12) | COMPONENT TYPE (J14) | COMPONENT REQUIRED NUMBER (NUMBER/SHEET) (J31) |
|---|---|---|---|
| SUBSTRATE A | S11 | P11 | N11 |
| | S12 | P12 | N12 |
| | S13 | P13 | N13 |
| | ... | ... | ... |

FIG. 13

COMPONENT SUPPLY MONITORING INFORMATION JH4

| COMPONENT MOUNTING LINE NAME (J41) | MOUNTER TYPE (J11) | WORK AREA (J42) | COMPONENT SUPPLY DEVICE | | REPLENISHABLE TIME TT (J43) | COMPONENT REPLENISHMENT TIME LIMIT WT (J44) | WORK STANDARD TIME WS (J45) |
|---|---|---|---|---|---|---|---|
| | | | SET POSITION (J12) | DEVICE TYPE (J13) | | | |
| 2L1 | 2A1 | WA1 | S11 | AF | TTA1 | WTA1 | WSA1 |
| 2L1 | 2B1 | WA1 | S11 | AF | TTB1 | WTB1 | WSB1 |
| ... | ... | ... | ... | ... | ... | ... | ... |

COMPONENT REPLENISHMENT MANAGEMENT SYSTEM AND COMPONENT MOUNTING SYSTEM

CROSS-REFERENCE TO RELATED APPLICATION

This application is a National Stage of International Patent Application No. PCT/JP2018/020795, filed May 30, 2018, the entire content of which is incorporated herein by reference.

TECHNICAL FIELD

The present disclosure relates to a component replenishment management system that manages component replenishment work for each of a plurality of component supply devices attached to each component mounter on a component mounting line, and a component mounting system including the component replenishment management system.

BACKGROUND ART

A component mounting line for producing a component mounting substrate in which an electronic component (hereinafter simply referred to as the "component") is mounted on a substrate such as a printed wiring substrate is configured by connecting a plurality of component mounters that mount the component on a substrate. A plurality of component supply devices that can mount a component storage member are provided in parallel in each component mounter. When a component mounting substrate is produced by each component mounter in the component mounting line, an operator performs setup work such as mounting a component storage member required for production in a component supply device, and then production is started. During the production of the component mounting substrate, an operator performs component replenishment work for replenishing the component supply device with the component storage member according to consumption of the component accompanying the production of the component mounting substrate in order to prevent the supply of the component from the component supply device from being stopped and the production of the component mounting substrate from being stopped.

For example, Japanese Patent Laid-Open No. 2012-28660 discloses a technique for achieving improvement in the efficiency of the component replenishment work by an operator. In the technique disclosed in Japanese Patent Laid-Open No. 2012-28660, in a component mounting line in which a plurality of component mounters are disposed, processing of predicting a time zone for preannouncing running out of the component in a plurality of component supply devices (feeders) attached to each of the component mounters is executed, and processing for allocating an operator who performs the component replenishment work is executed in the component running out preannouncement time zone.

However, in the technique disclosed in Japanese Patent Laid-Open No. 2012-28660, the replenishment timing with the component storage member for each component supply device is set individually. For this reason, when attempting to perform the component replenishment work according to the replenishment timing set individually for each component supply device, the operator needs to go to the component mounter to which the component supply device is attached with high frequency, and cannot perform the component replenishment work efficiently.

SUMMARY

The present disclosure has been made in view of such circumstances, and provides a component replenishment management system capable of improving the efficiency of component replenishment work for a component supply device attached to each component mounter in a component mounting line, and a component mounting system including the component replenishment management system.

A component replenishment management system according to an aspect of the present disclosure is a system for managing, in a component mounting line in which a plurality of component mounters for mounting a component on a substrate to produce a component mounting substrate are connected, component replenishment work for replenishing a plurality of component supply devices provided side by side in a work area set to each of the plurality of component mounters with a component storage member. The component replenishment management system includes an emergency device extraction unit configured to extract, as an emergency device, a component supply device for which the component replenishment work is to be performed urgently based on a component replenishment time limit that is set for each of a plurality of the component supply devices in each of the work areas, the component replenishment time limit being time until the component replenishment work is required to be performed, an emergency time setting unit configured to set an emergency time zone from a predetermined time to an emergency time at which the component replenishment work is to be performed for the emergency device, a replenishable device identification unit configured to identify, as a replenishable device, a plurality of component supply devices that is allowed to be replenished with the component storage member based on a supply state of a component in each of a plurality of the component supply devices, and a replenishment target extraction unit configured to extract a replenishment target device that is a target of the component replenishment work within a range of the emergency time zone among the plurality of replenishable devices.

A component mounting system according to another aspect of the present disclosure includes a component mounting line in which a plurality of component mounters for mounting a component on a substrate to produce a component mounting substrate are connected, and the component replenishment management system that manages component replenishment work for replenishing a plurality of component supply devices provided side by side in a work area set to each of the plurality of component mounters with a component storage member.

The object, feature, and advantage of the present disclosure will become more clear by detailed description below and the accompanying drawings.

BRIEF DESCRIPTION OF THE DRAWINGS

FIG. 8 is a diagram for describing attachment information stored in a memory unit of a mounting control device;

FIG. 10 is a diagram for describing production plan information input to the component replenishment management system;

FIG. 13 is a diagram for describing component supply monitoring information generated by the component supply monitoring unit;

DETAILED DESCRIPTION

Hereinafter, a work plan management system and a component mounting system according to an embodiment of the present disclosure will be described with reference to the drawings.

[Overall Configuration of Component Mounting System]

Figure 1:
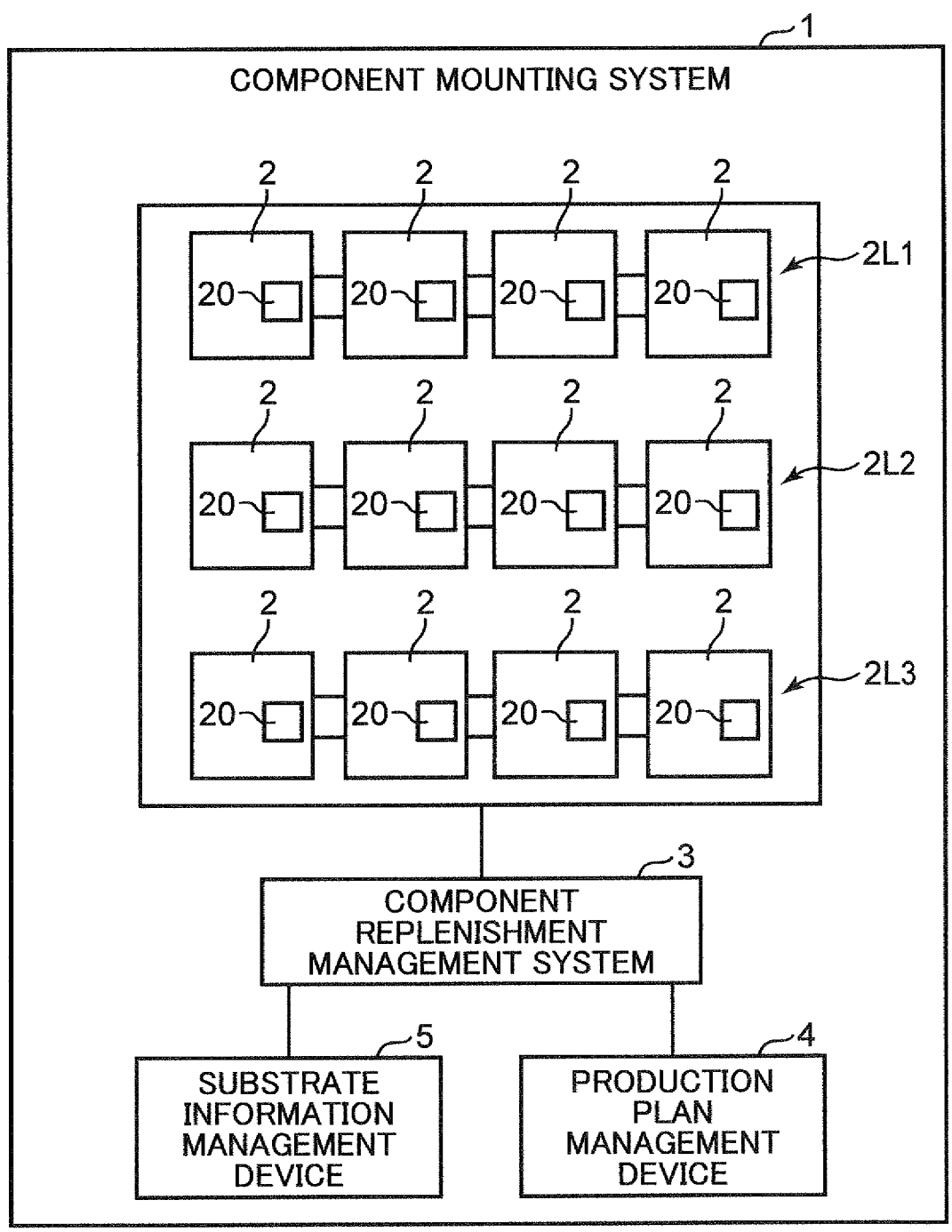
FIG. 1 is a diagram schematically showing a configuration of a component mounting system according to an embodiment of the present disclosure.

FIG. 1 is a diagram schematically showing a configuration of a component mounting system 1 according to an embodiment of the present disclosure. The component mounting system 1 includes a plurality of component mounting lines 2L1, 2L2, and 2L3, a component replenishment management system 3, a production plan management device 4, and a substrate information management device 5. In the component mounting system 1, a mounting control device 20 of each component mounter 2 that constitutes each of the component mounting lines 2L1, 2L2, and 2L3, the production plan management device 4, and the substrate information management device 5 are connected to the component replenishment management system 3 in a data communicable manner.

Each of the plurality of component mounting lines 2L1, 2L2, and 2L3 is configured by connecting the plurality of component mounters 2. Each of the plurality of component mounters 2 is connected in a manner arranged in a straight line by a connecting conveyor that conveys a substrate between the component mounters 2. In the example shown in FIG. 1, four of the component mounters 2 are connected in each of the three component mounting lines 2L1, 2L2, and 2L3.

<Configuration of Component Mounter>

Figure 2:
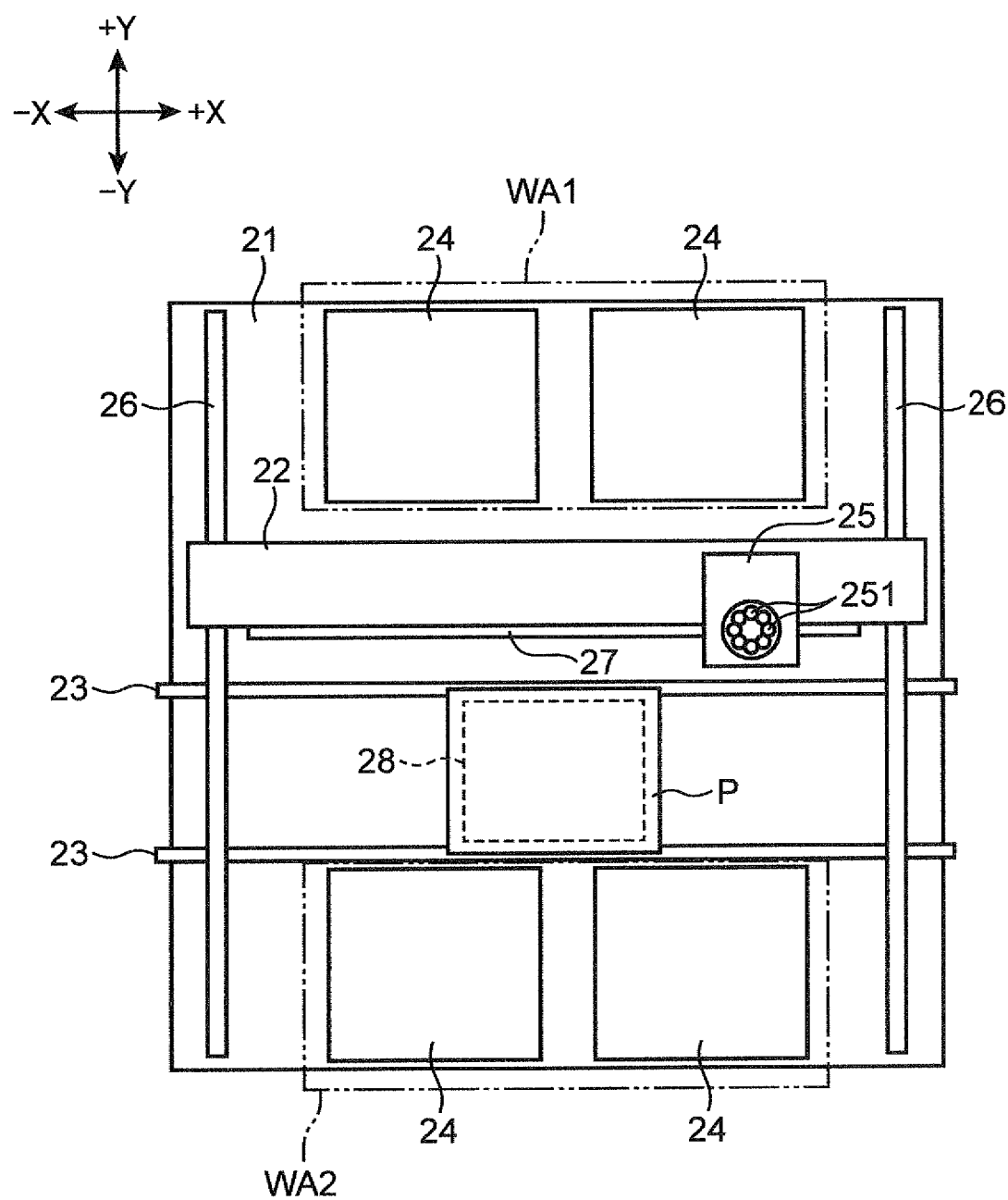
FIG. 2 is a plan view showing a configuration of a component mounter.

First, a configuration of the component mounter 2 will be described with reference to FIG. 2. FIG. 2 is a plan view showing the configuration of the component mounter 2. Note that, hereinafter, the directional relationship will be described using XY orthogonal coordinate axes. One direction side in the X-axis direction is referred to as "+X side", and the other direction side opposite to the one direction side in the X-axis direction is referred to as "−X side". Further, one direction side in the Y-axis direction is referred to as "+Y side", and the other direction side opposite to the one direction side in the Y-axis direction is referred to as "−Y side".

The component mounter 2 is a device that mounts the component on the substrate P to produce a component mounting substrate. The component mounter 2 includes a main body frame 21, a moving frame 22, a conveyor 23, a component supply unit 24, a head unit 25, a first drive mechanism 26, a second drive mechanism 27, and a substrate support device 28.

The main body frame 21 is a structure in which each unit constituting the component mounter 2 is disposed, and is formed in a substantially rectangular shape in a plan view when viewed in a direction orthogonal to both the X-axis direction and the Y-axis direction. The conveyor 23 extends in the X-axis direction and is disposed on the main body frame 21. The conveyor 23 conveys the substrate P in the X-axis direction. The substrate P conveyed on the conveyor 23 is positioned by a substrate support device 28 at a predetermined work position (a component mounting position where the component is mounted on the substrate P). The substrate support device 28 positions the substrate P by supporting the substrate P with a backup pin.

The component supply units 24 are disposed in a total of four locations, two locations in the X-axis direction in each of +Y side and −Y side regions in the Y-axis direction of the main body frame 21. The component supply unit 24 supplies the component mounted on the substrate P, and has a plurality of component supply devices provided in parallel. The component supply device disposed in the component supply unit 24 will be described later.

The moving frame 22 extends in the X-axis direction and is supported by the main body frame 21 so as to be movable in a predetermined moving direction (Y-axis direction). The head unit 25 is mounted on the moving frame 22. The head unit 25 is mounted on the moving frame 22 so as to be movable in the X-axis direction. That is, the head unit 25 is movable in the Y-axis direction along with the movement of the moving frame 22, and is also movable in the X-axis direction along the moving frame 22. The head unit 25 is movable between the component supply unit 24 and a predetermined working position of the substrate P conveyed by the conveyor 23, and takes out the component from the component supply unit 24 and mounts the taken-out component on the substrate P. The head unit 25 includes an adsorption nozzle 251. The adsorption nozzle 251 is a holder capable of sucking and holding the component supplied by the component supply unit 24. The adsorption nozzle 251 can communicate with any of a negative pressure generation device, a positive pressure generation device, and the atmosphere via an electric switching valve. That is, adsorption and holding of the component (taking out of the component) by the adsorption nozzle 251 becomes possible as a negative pressure is supplied to the adsorption nozzle 251, and thereafter, the adsorption and holding of the component is released as a positive pressure is supplied.

The first drive mechanism 26 is disposed in end portions on the +X side and −X side of the main body frame 21. The first drive mechanism 26 is a mechanism that moves the moving frame 22 in the Y-axis direction. The first drive mechanism 26 is configured to include, for example, a drive motor, a ball screw shaft that extends in the Y-axis direction and is connected to the drive motor, and a ball nut that is provided on the moving frame 22 and screwed with the ball screw shaft. The first drive mechanism 26 having such a configuration moves the moving frame 22 in the Y-axis direction by the ball nut moving forward and backward along the ball screw shaft as the ball screw shaft is rotationally driven by the drive motor.

The second drive mechanism 27 is provided on the moving frame 22. The second drive mechanism 27 is a mechanism that moves the head unit 25 in the X-axis direction along the moving frame 22. Similar to the first drive mechanism 26, the second drive mechanism 27 includes, for example, a drive motor, a ball screw shaft that extends in the X-axis direction and is connected to the drive motor, and a ball nut that is provided on the head unit 25 and screwed with the ball screw shaft. The second drive mechanism 27 having such a configuration moves the head unit 25 in the X-axis direction by the ball nut moving forward and backward along the ball screw shaft as the ball screw shaft is rotationally driven by the drive motor.

<Regarding Component Supply Device>

The component supply devices provided in parallel in the component supply unit 24 are roughly classified into a tape feeder, a tray feeder, and a stick feeder according to a difference in a component supply system. In each of the component supply units 24 of the component mounter 2, one type of component supply devices having the same component supply system may be disposed, or two or more types of component supply devices having different component supply systems may be disposed.

(Tape Feeder)

First, a tape feeder serving as the component supply device is configured such that a component storage tape containing the components at predetermined intervals is wound around a reel serving as a component storage member, and the component storage tape is sent out from the reel. The tape feeders are roughly classified into an automatic loading feeder (AF) in a first replenishment system and a splicing feeder in a second replenishment system depending on a difference in systems of replenishment with the component storage members. The splicing feeder in the second replenishment system is configured so that one reel is mounted. Immediately before sending out of the component storage tape from the reel is completed and the component runs out, transition is made from the component storage tape to a subsequent component storage tape. For this purpose, a rear end portion of the preceding component storage tape and a front end portion of the subsequent component storage tape are connected with a splicing tape or the like so as to be connected to each other. That is, in the splicing feeder in the second replenishment system, the splicing work of connecting with a splicing tape or the like is performed immediately before sending out of the component storage tape from one reel is completed and the component runs out. Accordingly, a replenishment timing with a reel wound with the subsequent component storage tape is restricted to a time point at which sending out of the preceding component storage tape is completed.

On the other hand, the AF in the first replenishment system is configured so that a plurality of reels can be mounted. When sending out of a component storage tape from a preceding reel wound with a component storage tape (hereinafter referred to as a "preceding component storage tape") by which the component is supplied first among the plurality of reels is completed, a component storage tape is sent out from a subsequent reel wound with a subsequent component storage tape automatically without the need of splicing work if there is a subsequent component storage tape that has already been inserted in the AF. That is, in the AF in the first replenishment system, the replenishment timing with a new reel is not restricted to a time point at which sending out of a component storage tape from a preceding reel wound with the preceding component storage tape is completed, and the component replenishment work can be performed at any time as long as a subsequent component storage tape can be inserted in the AF. Accordingly, there is more degree of freedom as compared with the splicing feeder.

Figure 3:
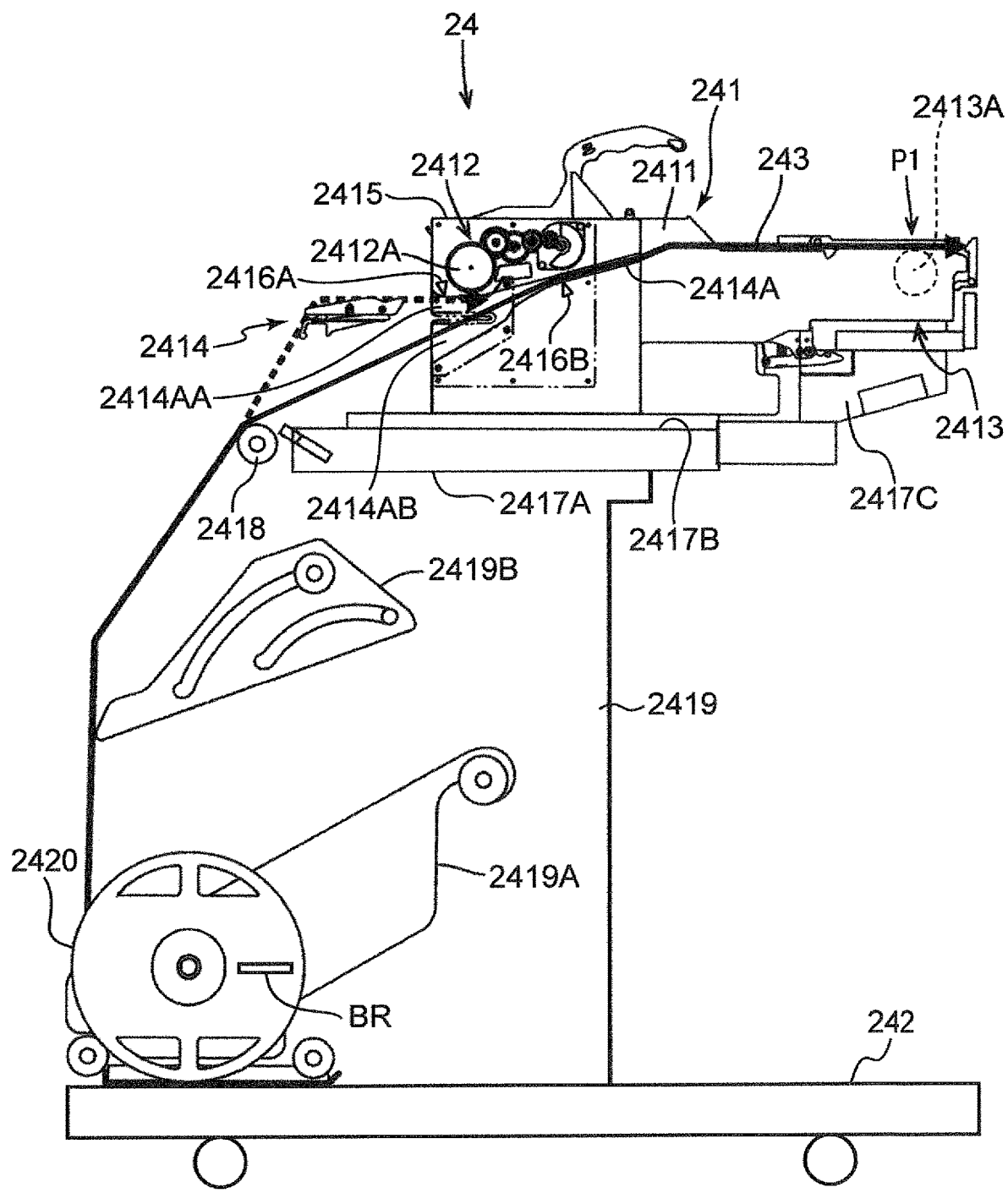
FIG. 3 is a diagram schematically showing a tape feeder as a component supply device disposed in a component supply unit of the component mounter.
Figure 4:
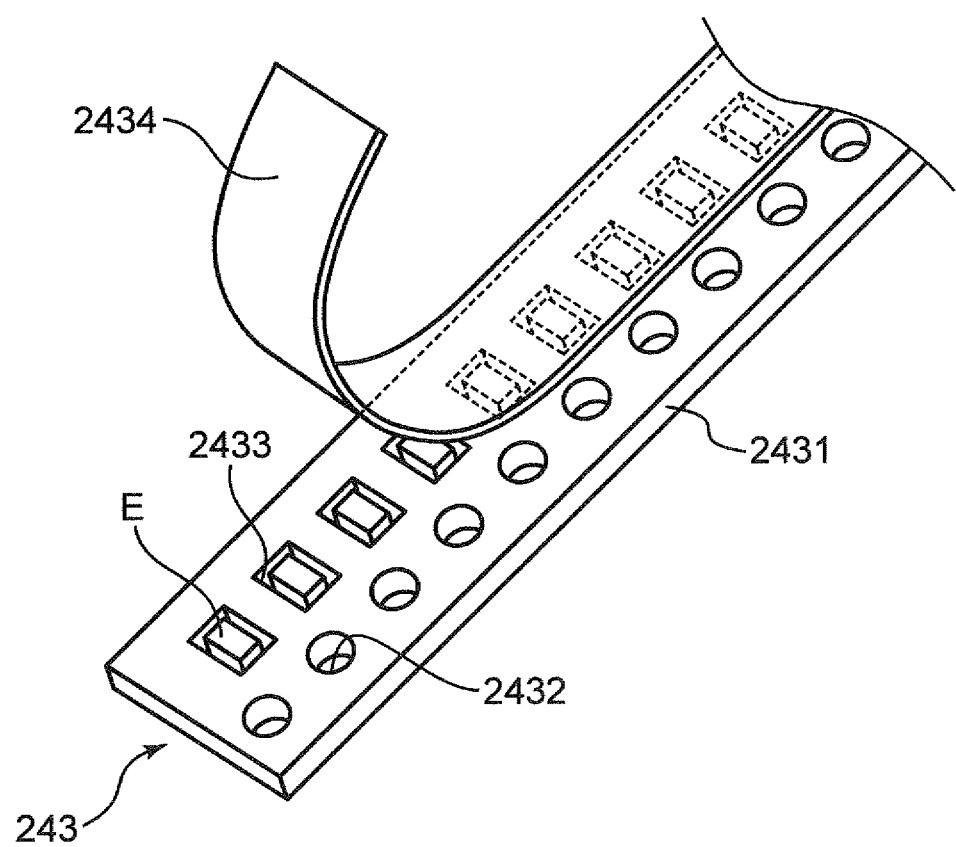
FIG. 4 is a perspective view showing a component storage tape mounted on the tape feeder.

The tape feeder disposed in the component supply unit 24 may be a mixture of the splicing feeder and the AF. In the present embodiment, a plurality of AFs capable of being mounted with a plurality of reels as the component storage member are disposed as the component supply device. The tape feeder including the AF as the component supply device will be described with reference to FIGS. 3 and 4. FIG. 3 is a diagram schematically showing a configuration of an AF 241, and FIG. 4 is a perspective view showing a component storage tape 243 mounted on the AF 241.

In the component supply unit 24, the AF 241 is disposed on a carriage 242. The AF 241 can be mounted with a plurality of reels 2420 around which the component storage tape 243 is wound.

Prior to description of the configuration of the AF 241, the component storage tape 243 will be described with reference to FIG. 4. The component storage tape 243 includes a carrier tape 2431 and a cover tape 2434. The carrier tape 2431 is a tape on which a plurality of component storage portions 2433 for storing a component E are arranged at predetermined intervals. Further, the carrier tape 2431 has, in one end portion in the width direction of the carrier tape 2431, conveying force transmission holes 2432, which are arranged at predetermined intervals and fitted to tooth portions of a first sprocket 2412A and a second sprocket 2413A in the AF 241 described later, and to which a conveying force for sending out the component storage tape 243 is transmitted by the first sprocket 2412A and the second sprocket 2413A. The cover tape 2434 is a tape attached to the carrier tape 2431 so as to cover the component storage portion 2433.

As shown in FIG. 3, the AF 241 is attached to a feeder attachment unit 2417A provided in the component supply unit 24. Specifically, the component supply unit 24 is provided with the feeder attachment unit 2417A and a reel support unit 2419. The feeder attachment unit 2417A is provided with a plurality of slots 2417B arranged at regular intervals in the X-axis direction and extending parallel to each other in the Y-axis direction, and a fixed base 2417C extending in the X-axis direction at a position in front of these slots 2417B. Then, the AF 241 is set in each of the slots 2417B, and each of the AFs 241 is fixed to the fixed base 2417C. In this manner, the plurality of AFs 241 are provided side by side on the carriage 242 in the component supply unit 24.

The reel support unit 2419 is positioned on the lower rear side of the feeder attachment unit 2417A, and supports a first reel holder 2419A and a second reel holder 2419B that rotatably support the reel 2420 in a state where they are vertically separated from each other. The component storage tape 243 is wound around the reel 2420 supported by each of the first reel holder 2419A and the second reel holder 2419B.

The AF 241 includes a feeder main body 2411. The AF 241 is fixed to the fixed base 2417C with the feeder main body 2411 inserted (set) in the slot 2417B. The feeder main body 2411 rotatably supports the first sprocket 2412A constituting a first tape feeding unit 2412 and the second sprocket 2413A constituting a second tape feeding unit 2413 which is separated in the Y-axis direction away from the reel support unit 2419 with respect to the first sprocket 2412A. The first sprocket 2412A and the second sprocket 2413A each includes a plurality of tooth portions arranged at predetermined intervals in the circumferential direction. The tooth portions of the first sprocket 2412A and the second sprocket 2413A can be fitted to the conveying force transmission holes 2432 formed on the carrier tape 2431 of the component storage tape 243.

The component storage tape 243 wound around the reel 2420 supported by each of the first reel holder 2419A and the second reel holder 2419B is guided to the first sprocket 2412A and the second sprocket 2413A while being guided by a guide roller 2418 provided at an upper end of the reel support unit 2419. The component storage tape 243 having the conveying force transmission hole 2432 fitted to the tooth portions of the first sprocket 2412A and the second sprocket 2413A is sent out by the rotation of the first sprocket 2412A and the second sprocket 2413A, and the component E is taken out at a component supply position P1.

The AF 241 further includes a tape support member 2414 detachably fixed to a rear end portion of the feeder main body 2411, an operation input unit 2415 disposed on an upper rear surface of the feeder main body 2411, and first and second tape detection sensors 2416A and 2416B.

As shown in FIG. 3, the tape support member 2414 divides a rear end portion of a tape travelling path 2414A on which the component storage tape 243 travels inside the feeder main body 2411 into two, upper and lower paths (an upper side path 2414AA and a lower side path 2414AB), and also supports the component storage tape 243 that passes through the upper side path 2414AA from below. More specifically, the rear end portion of the tape travelling path 2414A has a shape that spreads in the vertical direction from the front to the rear. The tape support member 2414 is inserted into the tape travelling path 2414A from the rear of the feeder main body 2411 and is detachably fixed to the feeder main body 2411. In this manner, the rear end portion of the tape travelling path 2414A is divided into the upper side path 2414AA and the lower side path 2414AB by the tape support member 2414.

The first tape detection sensor 2416A and the second tape detection sensor 2416B are provided so as to face the tape travelling path 2414A and detect the presence or absence of the component storage tape 243 passing through the tape travelling path 2414A. More specifically, the first tape detection sensor 2416A is provided in front of a merging point of the upper side path 2414AA and the lower side path 2414AB and at a position facing the tape travelling path 2414A from below. On the other hand, the second tape detection sensor 2416B is provided at a position facing the upper side path 2414AA from above, and, in this manner, detects the presence or absence of the component storage tape 243 in the upper side path 2414AA.

The operation input unit 2415 is used by the operator to send out and reversely send the component storage tape 243 as necessary.

Figure 7:
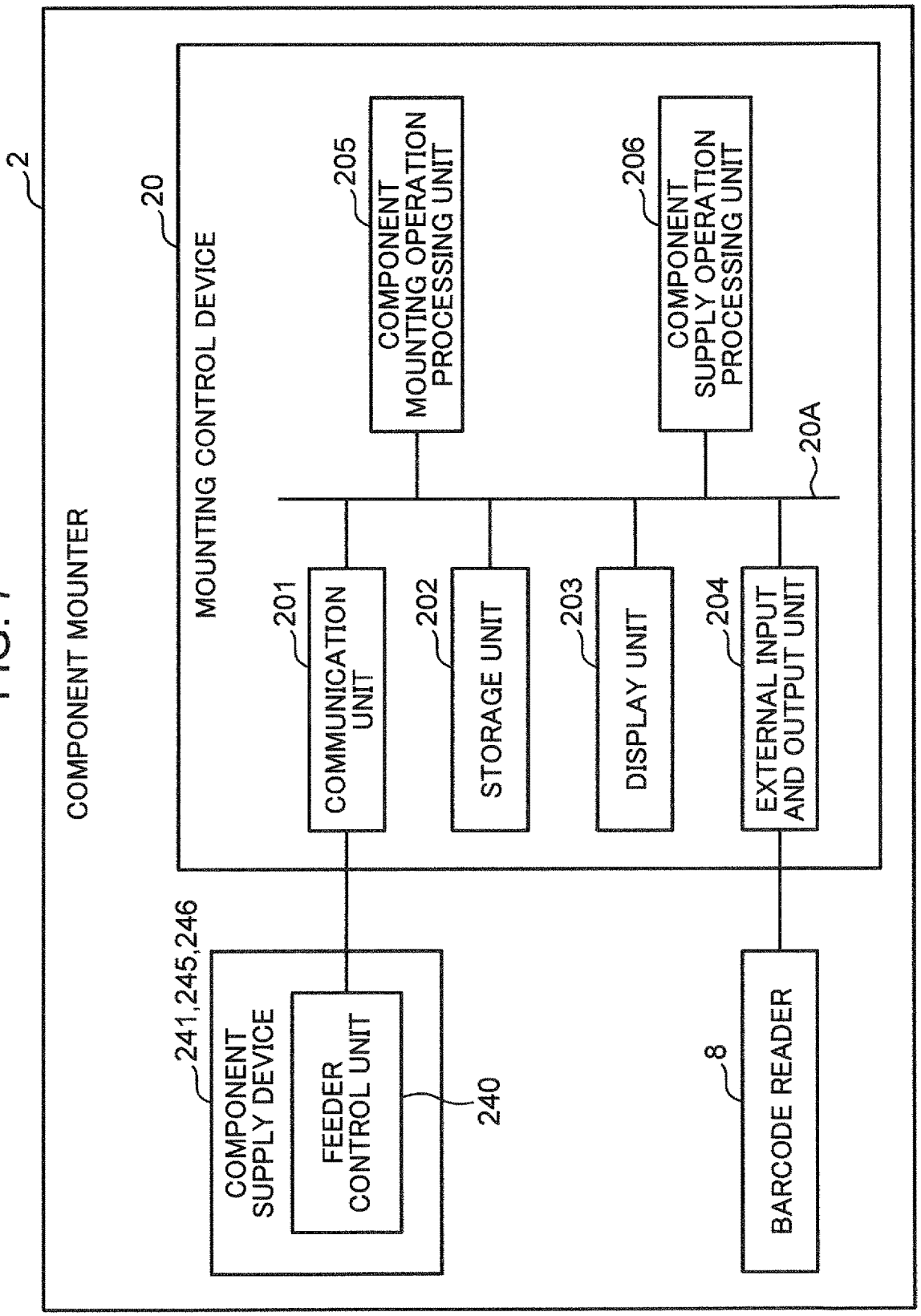
FIG. 7 is a block diagram showing a control system of the component mounter.

A component supply operation of the AF 241 configured as above is as described below. First, as a preparatory work, an operator attaches the reel 2420, around which the preceding component storage tape 243 is wound, to the first reel holder 2419A on a lower stage of the reel support unit 2419. At this time, the operator performs a reading operation of reading a component type identifying barcode BR (recording portion, see FIG. 3) provided on the reel 2420 with a barcode reader 8 (FIG. 7). The component type identifying barcode BR is obtained by encoding and recording replenishment component type information or the like for identifying a component type of the component E stored in the component storage tape 243 wound around the reel 2420.

The operator inserts a front end portion of the component storage tape 243 wound around the reel 2420 attached to the first reel holder 2419A into the upper side path 2414AA from the rear of the feeder main body 2411. In this manner, the front end portion of the preceding component storage tape 243 is supported by the tape support member 2414 in a state of being fitted to the first sprocket 2412A. Thereafter, the operator operates the operation input unit 2415 to input an instruction to rotate the first sprocket 2412A, send out the component storage tape 243, and fit the front end portion of the component storage tape 243 to the second sprocket 2413A.

The component supply operation of the AF 241 is started in a state where the above-mentioned preparation work is finished. In the AF 241, the second sprocket 2413A rotates, which causes the component storage tape 243 to be sent out. Note that the first sprocket 2412A is configured to idle, and, at this time, the component storage tape 243 can be sent out only by rotation of the second sprocket 2413A.

Next, the operator removes the tape support member 2414 from the feeder main body 2411 in a state where the preceding component storage tape 243 is being sent out from the reel 2420. When the tape support member 2414 is removed, the component storage tape 243 is displaced to a bottom surface portion of the tape travelling path 2414A by its own weight. In this manner, the fitting of the preceding component storage tape 243 to the first sprocket 2412A is released. At this time, since the component storage tape 243 is fitted to the second sprocket 2413A, even if the fitting to the first sprocket 2412A is released, the component storage tape 243 continues to be sent out by the rotation of the second sprocket 2413A.

Next, in a state where the preceding component storage tape 243 is being sent out from the reel 2420, the operator mounts the tape support member 2414 on the feeder main body 2411 and moves the reel 2420, around which the preceding component storage tape 243 is wound, from the first reel holder 2419A on the lower stage to the second reel holder 2419B on the upper stage. Next, in a state where the preceding component storage tape 243 is being sent out from the reel 2420 supported by the second reel holder 2419B on the upper stage, the operator attaches the reel 2420, around which the subsequent component storage tape 243 is wound, to the first reel holder 2419A on the lower stage, and inserts a front end portion of the component storage tape 243 into the upper side path 2414AA from the rear of the feeder main body 2411. In this manner, the front end portion of the subsequent component storage tape 243 is supported by the tape support member 2414 in a state of being fitted to the first sprocket 2412A. In this manner, the reel 2420 around which the subsequent component storage tape 243 is wound can be mounted in a state where the preceding component storage tape 243 wound around the reel 2420 does not run out of the component. Note that, even when mounting the reel 2420 around which the subsequent component storage tape 243 is wound, the operator performs the reading operation of reading the component type identifying barcode BR provided on the reel 2420 with the barcode reader 8 (FIG. 7), similar to in the case of the preceding component storage tape 243.

Thereafter, all the preceding component storage tape 243 is pulled out from the reel 2420 supported by the second reel holder 2419B on the upper stage, and its rear end passes through the position of the second tape detection sensor 2416B. When the absence of the preceding component storage tape 243 is detected, sending out of the subsequent component storage tape 243 from the reel 2420 supported by the first reel holder 2419A on the lower stage is automatically started. Then, the operator removes the reel 2420 that has run out of the component from the second reel holder 2419B on the upper stage, and moves the reel 2420, around which the subsequent component storage tape 243 is wound, from the first reel holder 2419A on the lower stage to the second reel holder 2419B on the upper stage. At this time, the operator can replenish the AF 241 with a new reel around which the component storage tape 243 is wound. The new reel with which the AF 241 is replenished is attached to the first reel holder 2419A on the lower stage by the operator. Also at this time, the operator performs the reading operation of reading the component type identifying barcode provided on the new reel with the barcode reader 8. Here, the timing of the component replenishment work with the new reel is identified by the component replenishment management system 3 without being restricted to a time point at which the reel 2420, around which the preceding component storage tape 243 is wound, runs out of the component.

Note that, in a state where the preceding component storage tape 243 is sent out from the reel 2420 supported by the second reel holder 2419B on the upper stage, and a front end portion of the subsequent component storage tape 243 wound around the reel 2420 supported by the first reel holder 2419A on the lower stage is inserted in the upper side path 2414AA, a new reel cannot be mounted. On the other hand, in a state where all the preceding component storage tape 243 is pulled out from the reel 2420 supported by the second reel holder 2419B on the upper stage, and sending out of the subsequent component storage tape 243 from the reel 2420 supported by the first reel holder 2419A on the lower stage is automatically started, a new reel can be mounted.

(Tray Feeder)

Figure 5:
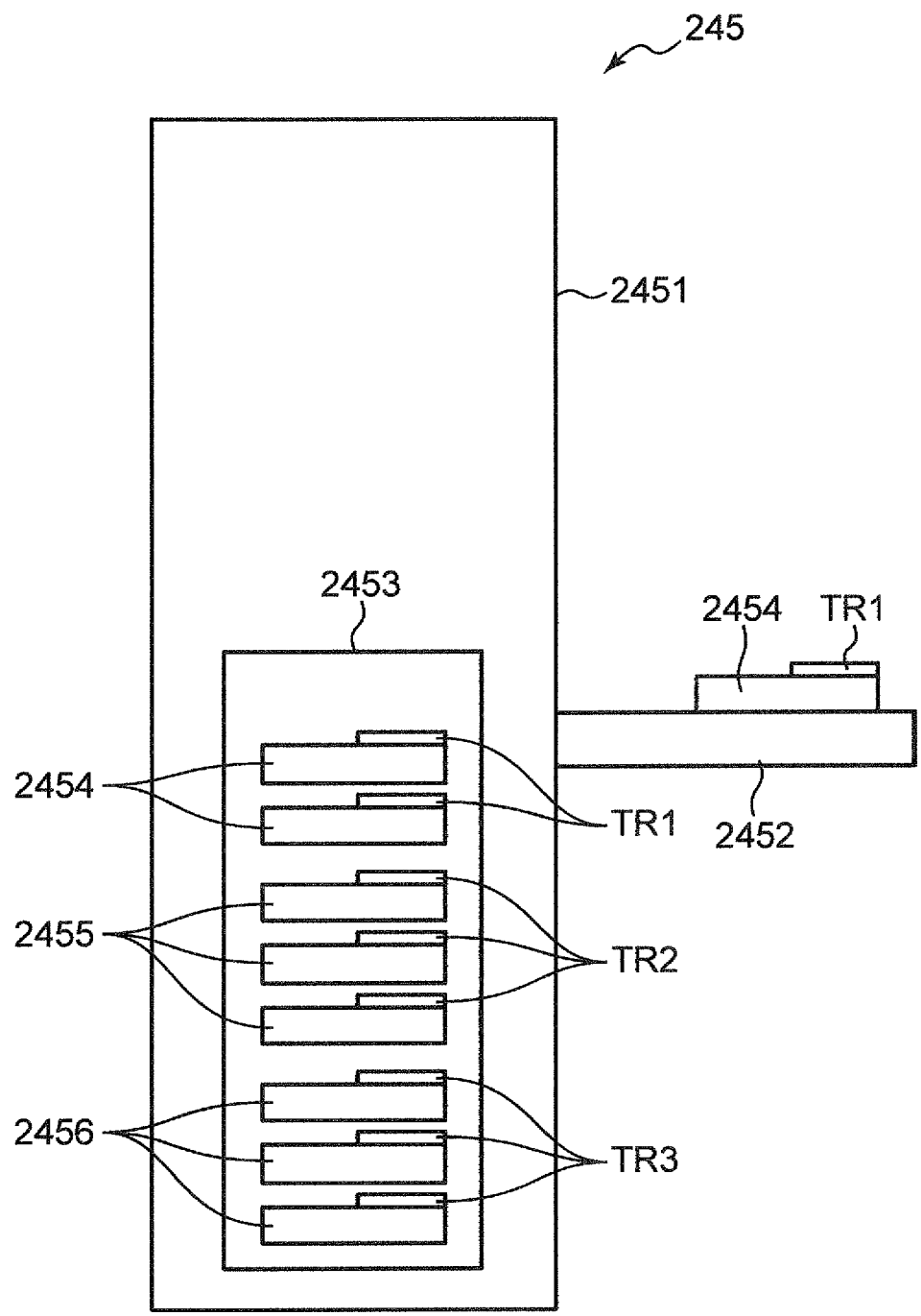
FIG. 5 is a diagram schematically showing a tray feeder as the component supply device disposed in the component supply unit of the component mounter.

Next, the tray feeder as the component supply device will be described with reference to FIG. 5. FIG. 5 is a diagram schematically showing a configuration of a tray feeder 245. A plurality of tray feeders 245 can be installed side by side in the component supply unit 24. The tray feeder 245 is configured such that one magazine 2453 can move vertically in a cover body 2451. The magazine 2453 accommodates a plurality of first pallets 2454, a plurality of second pallets 2455, and a plurality of third pallets 2456.

At least one first tray TR1 holding a plurality of components is placed on each of the first pallets 2454. The components held in the first tray TR1 are the same type of the components for each of the first pallets 2454. Similarly, at least one second tray TR2 holding a plurality of components is placed on each of the second pallets 2455. The components held in the second tray TR2 are the same type of the components for each of the second pallets 2455. However, the type of the component held on the second tray TR2 is different from that of the component held on the first tray TR1. Further, at least one third tray TR3 holding a plurality of components is placed on each of the third pallets 2456. The components held in the third tray TR3 are the same type of the components for each of the third pallets 2456. However, the type of the component held on the third tray TR3 is different from that of the component held on each of the first tray TR1 and the second tray TR2.

Each of the first pallet 2454, the second pallet 2455, and the third pallet 2456 has a function as the component storage member on which the tray TR1, TR2, or TR3 holding a plurality of components is placed. Each of the first pallet 2454, the second pallet 2455, and the third pallet 2456 housed in the magazine 2453 is moved to a table 2452 that is provided so as to project outward from the cover body 2451 during production of the component mounting substrate, and, in this manner, the components are supplied in a state of being held by the trays TR1, TR2, and TR3.

The tray feeder 245 is a component supply device in the first replenishment system, similar to the AF 241 described above. During the production of the component mounting substrate, even if the component held in the first tray TR1 placed on one of the plurality of first pallets 2454 runs out, another first pallet 2454 is moved to the table 2452, and, in this manner, the component is supplied in a state of being held by the first tray TR1. At this time, the operator can take out the first pallet 2454 that has run out of the component from the cover body 2451 and replenish the tray feeder 245 with a new first pallet during the production of the component mounting substrate. Similarly, during the production of the component mounting substrate, even if the component held in the second tray TR2 placed on one of the plurality of second pallets 2455 runs out, another second pallet 2455 is moved to the table 2452, and, in this manner, the component is supplied in a state of being held by the second tray TR2. At this time, the operator can take out the second pallet 2455 that has run out of the component from the cover body 2451 and replenish the tray feeder 245 with a new second pallet during the production of the component mounting substrate. Further, during the production of the component mounting substrate, even if the component held in the third tray TR3 placed on one of the plurality of third pallets 2456 runs out, another third pallet 2456 is moved to the table 2452, and, in this manner, the component is supplied in a state of being held by the third tray TR3. At this time, the operator can take out the third pallet 2456 that has run out of the component from the cover body 2451 and replenish the tray feeder 245 with a new third pallet during the production of the component mounting substrate.

Note that, when replenishing the tray feeder 245 with a new pallet, the operator performs a reading operation of reading a component type identifying barcode provided on the new pallet with the barcode reader 8. The component replenishment management system 3 performs management regarding a plan of component replenishment work for the tray feeder 245 with a new pallet.

(Stick Feeder)

Figure 6:
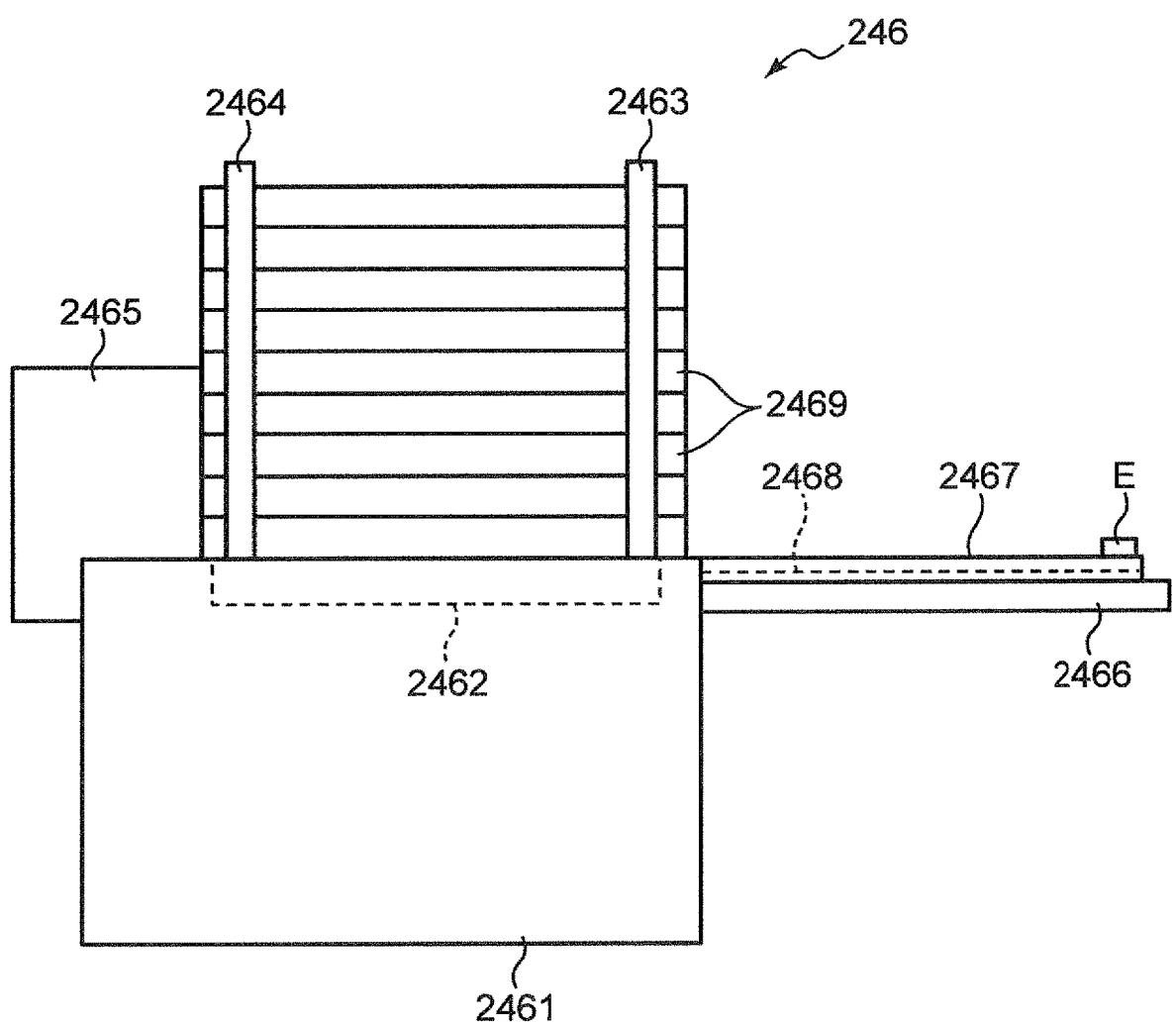
FIG. 6 is a diagram schematically showing a stick feeder as the component supply device disposed in the component supply unit of the component mounter.

Next, a stick feeder as the component supply device will be described with reference to FIG. 6. FIG. 6 is a diagram schematically showing a configuration of the stick feeder 246. A plurality of stick feeders 246 can be provided side by side in the component supply unit 24. The stick feeder 246, similar to the AF 241 described above, is a component supply device in the first replenishment system. The stick feeder 246 is configured to supply the component E stored in a stick 2469 as a cylindrical component storage member while pushing the component E out from the stick 2469. The stick feeder 246 includes a frame main body 2461, a stick table 2462 provided in an upper portion of the frame main body 2461, a first chuck 2463 and a second chuck 2464, a component pushing-out mechanism unit 2465, a guide frame 2466, a pair of guide rails 2467, and a conveyor belt 2468.

The frame main body 2461 has a hollow box shape with an open top. The stick table 2462 is arranged on an inner side of the upper portion of the frame main body 2461. A plurality of sticks 2469 can be placed in a stacked state on the stick table 2462. The first chuck 2463 can simultaneously hold front end portions of the sticks 2469 other than the lowest one of the plurality of sticks 2469 on the stick table 2462. Similarly, the second chuck 2464 can simultaneously hold rear end portions of the sticks 2469 other than the lowest one of the plurality of sticks 2469 on the stick table 2462.

The component pushing-out mechanism unit 2465 pushes the component E forward from the lowest stick 2469 of the plurality of sticks 2469 on the stick table 2462. The guide frame 2466 is fixed to a front portion of the frame main body 2461, and a pair of guide rails 2467 are supported by the guide frame 2466. Then, the conveyor belt 2468 is provided between the pair of guide rails 2467. The component E pushed forward by the component pushing-out mechanism unit 2465 is conveyed by the conveyor belt 2468 along the pair of guide rails 2467. In this manner, the component E stored in the stick 2469 is supplied to the component supply position.

When the lowest stick 2469 runs out of the component due to the component supply operation, the first and second chucks 2463 and 2464 hold the sticks 2469 other than the lowest stick 2469. In this state, the stick table 2462 is displaced to a support releasing position for releasing the support of the stick 2469, so that only the lowest stick 2469 is dropped to an inner bottom portion of the frame main body 2461 by its own weight. Note that, after the stick 2469 that has run out of the component is discarded, the stick table 2462 returns to the support position of the stick 2469, and the first and second chucks 2463 and 2464 are opened, so that the remaining sticks 2469 are placed on the stick table 2462, and the component E is supplied from the next (lowest) stick 2469.

During production of the component mounting substrate, when the stick 2469 that has run out of the component drops on the inner bottom portion of the frame main body 2461, the operator can replenish the stick feeder 246 with a new stick. Note that, when replenishing the stick feeder 246 with a new stick, the operator performs a reading operation of reading a component type identifying barcode provided on the new stick with the barcode reader 8.

The component replenishment management system 3 performs management regarding a plan of component replenishment work for the stick feeder 246 with a new stick.

<Control System of Component Mounter>

A control system of the component mounter 2 will be described with reference to a block diagram of FIG. 7. The component mounter 2 includes the mounting control device 20. The mounting control device 20 is a device that integrally controls the component mounting operation of the component mounter 2 and also controls the operation of the component supply devices including the AF 241, the tray feeder 245, and the stick feeder 246. The mounting control device 20 includes, for example, a microcomputer incorporating a storage device such as a read only memory (ROM) that stores a control program, a flash memory that temporarily stores data, or the like, and controls the component mounting operation of the component mounter 2 and the operation of the component supply device by reading the control program. The mounting control device 20 includes a communication unit 201, a memory unit 202, a display unit 203, an external input and output unit 204, a component mounting operation processing unit 205, and a component supply operation processing unit 206, which are connected via a bus 20A.

The communication unit 201 is an interface for data communication with the component supply device and the component replenishment management system 3. All the component supply devices disposed in each of the component supply units 24 of the component mounter 2 are connected to the communication unit 201. The external input and output unit 204 is an interface for data communication with the barcode reader 8.

The memory unit 202 stores attachment information JH1 shown in FIG. 8. The attachment information JH1 is information on the component in the component supply device disposed in each of the component supply units 24 of the component mounter 2. The attachment information JH1 associates mounter type information J11, set position information J12, device type information J13, component type information J14, preceding component remaining number information J15, total component remaining number information J16, component remaining number warning value information J17, and component remaining number stop value information J18 with each other. The mounter type information J11 is information for identifying the component mounter 2. The set position information J12 is information indicating a position within the component supply unit 24 of the component supply device. In a case where the component supply device is the AF 241, the set position information J12 is information identified by a position of the slot 2417B in the feeder attachment unit 2417A. Slot numbers different from each other are assigned to the slots 2417B, and the position of each of the slots 2417B, that is, a set position is identified by this slot number. The device type information J13 is information indicating a type of the component supply device (type of a component supply system and a replenishment system).

The component type information J14 is information for identifying a component type of the component supplied by each of the component supply devices, and is indicated by identification information for identifying the component, component name information indicating the name of the component, or the like. The preceding component remaining number information J15 is information indicating the remaining number of components of the preceding component storage member in each of the component supply devices. The total component remaining number information J16 is information indicating the total number of remaining components in each of the component supply devices. The component remaining number warning value information J17 is information indicating that the total number of remaining components represented by the total component remaining number information J16, before the component runs out in each component supply device, has a predetermined value (component remaining number warning value) for which a warning needs to be issued. The component remaining number stop value information J18 is information that is particularly applied to the splicing feeder, and information indicating that the total number of remaining components represented by the total component remaining number information J16 has a predetermined value (component remaining number stop value) for which sending out of the tape for the splicing work needs to be stopped.

In the splicing feeder, the splicing work to join tapes for replenishment cannot be performed even if the sending out of a preceding component storage tape is stopped after the remaining number of components in the preceding component storage tape becomes "0: zero". For this reason, in the splicing feeder, the component remaining number stop value represented by the component remaining number stop value information J18 is normally preferably set to a value larger than "0: zero". Unlike the splicing feeder, the AF 241, the tray feeder 245, and the stick feeder 246 do not have the concept of "a predetermined value for which sending out of the tape feeding needs to be stopped for the splicing work". Therefore, in the AF 241, the tray feeder 245, and the stick feeder 246, the component remaining number stop value represented by the component remaining number stop value information J18 is normally preferably set to "0: zero" which is when the component actually runs out, or to a value smaller than the component remaining number warning value.

The display unit 203 displays information or the like received by the communication unit 201 and transmitted from the component replenishment management system 3 described later. The component mounting operation processing unit 205 controls the operation of the head unit 25 and the like in the production of the component mounting substrate by the component mounter 2. The component supply operation processing unit 206 performs processing of integrally controlling the operation of each of the component supply devices by transmitting a control signal to a feeder control unit 240 of each of the component supply devices via the communication unit 201.

Note that, as shown in FIG. 2, work areas WA1 and WA2 in which the component replenishment work is performed by an operator are set in the component mounter 2. In the present embodiment, the first work area WA1 including the component supply unit 24 disposed on the +Y side of the component mounter 2 and the second work area WA2 including the component supply unit 24 disposed on the −Y side of the component mounter 2 are set in the component mounter 2. In the component mounting lines 2L1, 2L2, and 2L3 in which the plurality of component mounters 2 are connected, the work areas WA1 positioned on the +Y side of the component mounters 2 are disposed side by side in the X-axis direction, and the work areas WA2 positioned on the −Y side of the component mounters 2 are disposed side by side in the X-axis direction.

[Configuration of Component Replenishment Management System]

The component replenishment management system 3 is a system that manages a plan of the component replenishment work to be performed by the operator in accordance with the production of the component mounting substrate in the first and second work areas WA1 and WA2 set in each of the component mounters 2. The component replenishment work includes new reel replenishment work for the AF 241, new pallet replenishment work for the tray feeder 245, new stick replenishment work for the stick feeder 246, and splicing work for the splicing feeder.

Figure 9:
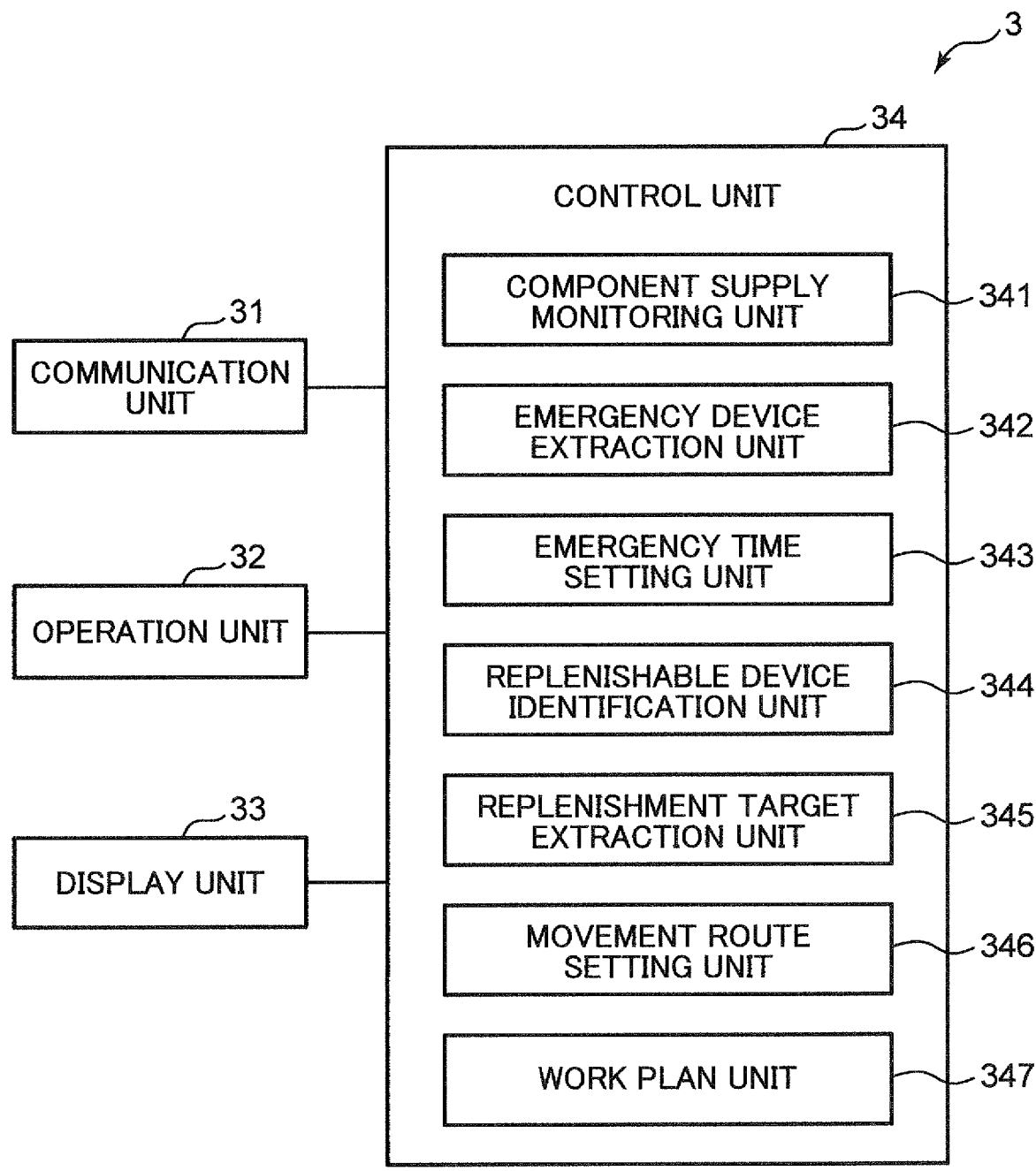
FIG. 9 is a block diagram showing a configuration of a component replenishment management system.

FIG. 9 is a block diagram showing a configuration of the component replenishment management system 3. As shown in FIG. 1, the component replenishment management system 3 is connected to the mounting control device 20 of each of the component mounters 2, the production plan management device 4, and the substrate information management device 5 in a data communicable manner. Further, the component replenishment management system 3 includes, for example, a microcomputer, and includes a communication unit 31, an operation unit 32, a display unit 33, and a control unit 34, as shown in FIG. 9.

The operation unit 32 includes a touch panel, a numeric keypad, a start key, a setting key, and the like, and receives operation of the operator and various settings on the component replenishment management system 3. The display unit 33 displays work plan information and the like generated by a work plan unit 347 of the control unit 34 described later. The communication unit 31 is an interface for realizing data communication with the mounting control device 20 of each of the component mounters 2, the production plan management device 4, and the substrate information management device 5. The communication unit 31 acquires information transmitted from the mounting control device 20 of each of the component mounters 2, the production plan management device 4, and the substrate information management device 5, and provides the acquired information to the control unit 34. Further, the communication unit 31 is provided with work plan information and the like generated by the work plan unit 347 from the control unit 34, and transmits (outputs) the work plan information to the mounting control device 20 of each of the component mounters 2.

Here, the production plan management device 4 and the substrate information management device 5, which are connected to the component replenishment management system 3 in a data communicable manner, will be described. The production plan management device 4 is a device for managing the production plan of the component mounting substrate by each of the component mounters 2. The production plan management device 4 includes, for example, a microcomputer. The production plan management device 4 transmits production plan information regarding the production plan of the component mounting substrate to the component replenishment management system 3 by the operation by the operator who makes the production plan. FIG. 10 is a diagram for describing production plan information JH2 transmitted from the production plan management device 4 and input to the component replenishment management system 3. The production plan information JH2 is information in which production order information J21, substrate type information J22, production quantity information J23, and cycle time information J24 are associated. The production order information J21 is information indicating the production order of the component mounting substrate. The substrate type information J22 is information indicating a type of the substrate P used for the production of the component mounting substrate. The production quantity information J23 is information indicating the production quantity of the component mounting substrate for each substrate type. The cycle time information J24 is information indicating the time (second/sheet) required to finish one component mounting substrate when the component is mounted on the substrate P.

Figure 11:
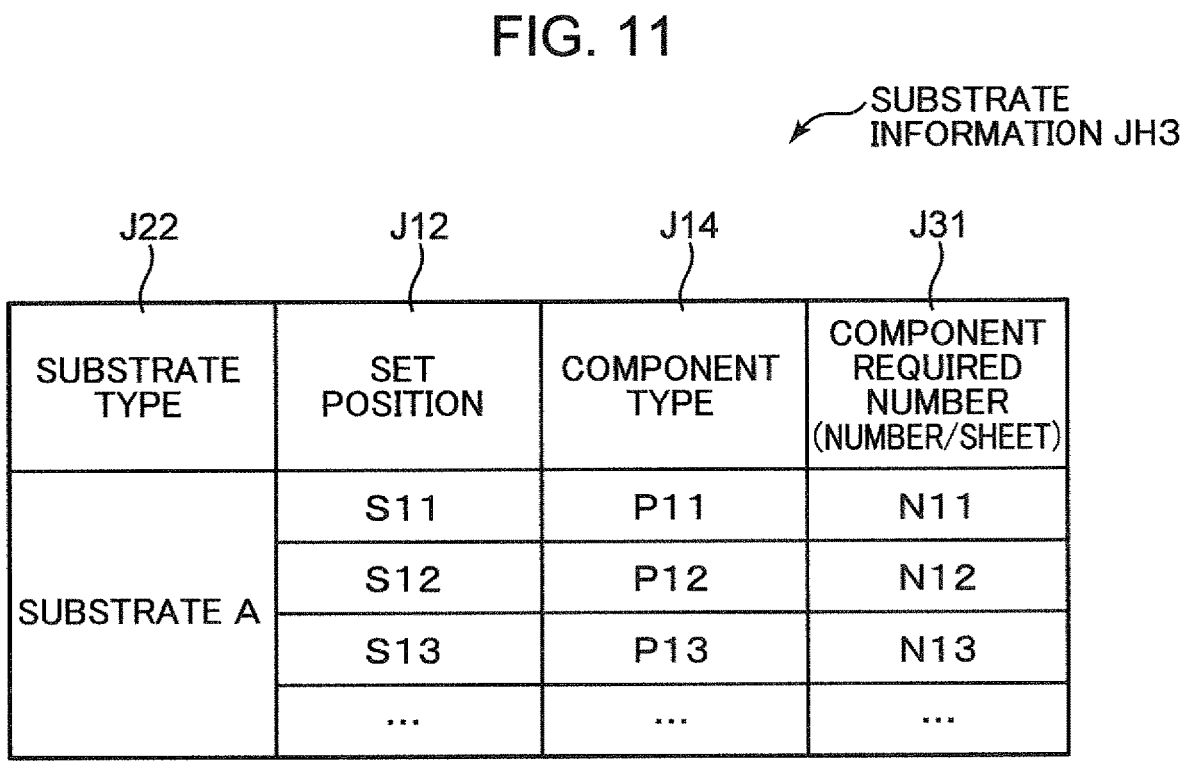
FIG. 11 is a diagram for describing substrate information input to the component replenishment management system.

The substrate information management device 5 is a device for managing substrate information that is referred to at the time of the production of the component mounting substrate by each of the component mounters 2. The substrate information management device 5 includes, for example, a microcomputer. The substrate information management device 5 transmits the substrate information to the component replenishment management system 3 by the operation of the operator. FIG. 11 is a diagram for describing substrate information JH3 transmitted from the substrate information management device 5 and input to the component replenishment management system 3. The substrate information JH3 is information in which the substrate type information J22, the set position information J12, the component type information J14, and component required number information J31 are associated. The component required number information J31 is information regarding the required number (number/sheet) of the components necessary for production of one component mounting substrate. The substrate information JH3 is rewritten every time a type of the substrate P indicated by the substrate type information J22 is switched.

The substrate information JH3 is transmitted to the mounting control device 20 of each of the component mounters 2 via the component replenishment management system 3 and is referred to at the time of production of the component mounting substrate by each of the component mounters 2. Specifically, the component mounting operation processing unit 205 of the mounting control device 20 controls the operation of the head unit 25 and the like based on the substrate information JH3 in the production of the component mounting substrate by the component mounter 2. In the substrate information JH3, at the time of production of the substrate type indicated by the substrate type information J22, when the component is supplied by the component supply device disposed at the set position indicated by the set position information J12, the head unit 25 is controlled to take out the component indicated by the component type information J14 from the component supply device. The substrate information management device 5 stores the substrate information JH3 of the substrate type currently produced. In other words, when the substrate information JH3 stored in the substrate information management device 5 is transmitted to the mounting control device 20 via the component replenishment management system 3, the component mounting substrate is produced based on the substrate information JH3. Therefore, in order to produce a substrate of a next substrate type after the production of the substrate of the substrate type of the current substrate information JH3 is finished, the substrate information JH3 of the next substrate type must be stored in the substrate information management device 5.

The control unit 34 of the component replenishment management system 3 includes a central processing unit (CPU), a read only memory (ROM) that stores a control program, a random access memory (RAM) used as a work area of the CPU, and the like. The control unit 34 controls the communication unit 31, the operation unit 32, and the display unit 33 as the CPU executes the control program stored in the ROM, and also generates various types of information regarding the management of the plan of the component replenishment work. As shown in FIG. 9, the control unit 34 includes a component supply monitoring unit 341, an emergency device extraction unit 342, an emergency time setting unit 343, a replenishable device identification unit 344, a replenishment target extraction unit 345, a movement route setting unit 346, and the work plan unit 347.

Figure 12:
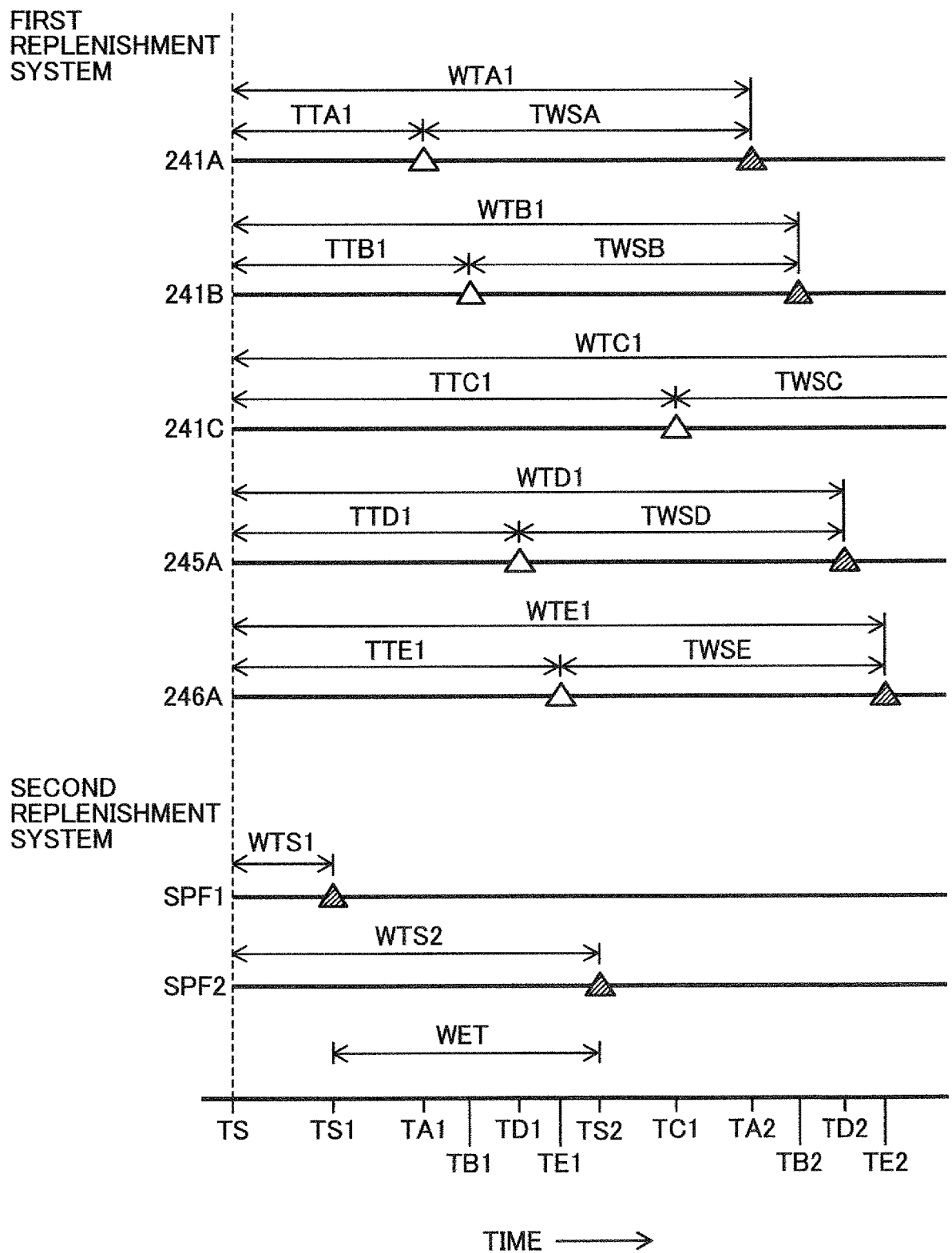
FIG. 12 is a diagram for describing control operation of a component supply monitoring unit, an emergency device extraction unit, an emergency time setting unit, and a replenishable device identification unit in the component replenishment management system.

Referring to FIG. 12 to FIG. 15 in addition to FIG. 9, the component supply monitoring unit 341, the emergency device extraction unit 342, the emergency time setting unit 343, the replenishable device identification unit 344, the replenishment target extraction unit 345, the movement route setting unit 346, and the work plan unit 347 in the control unit 34 will be described. FIG. 12 is a diagram for describing control operation of the component supply monitoring unit 341, the emergency device extraction unit 342, the emergency time setting unit 343, and the replenishable device identification unit 344. FIG. 13 is a diagram for describing component supply monitoring information JH4 generated by the component supply monitoring unit 341.

Figure 14:
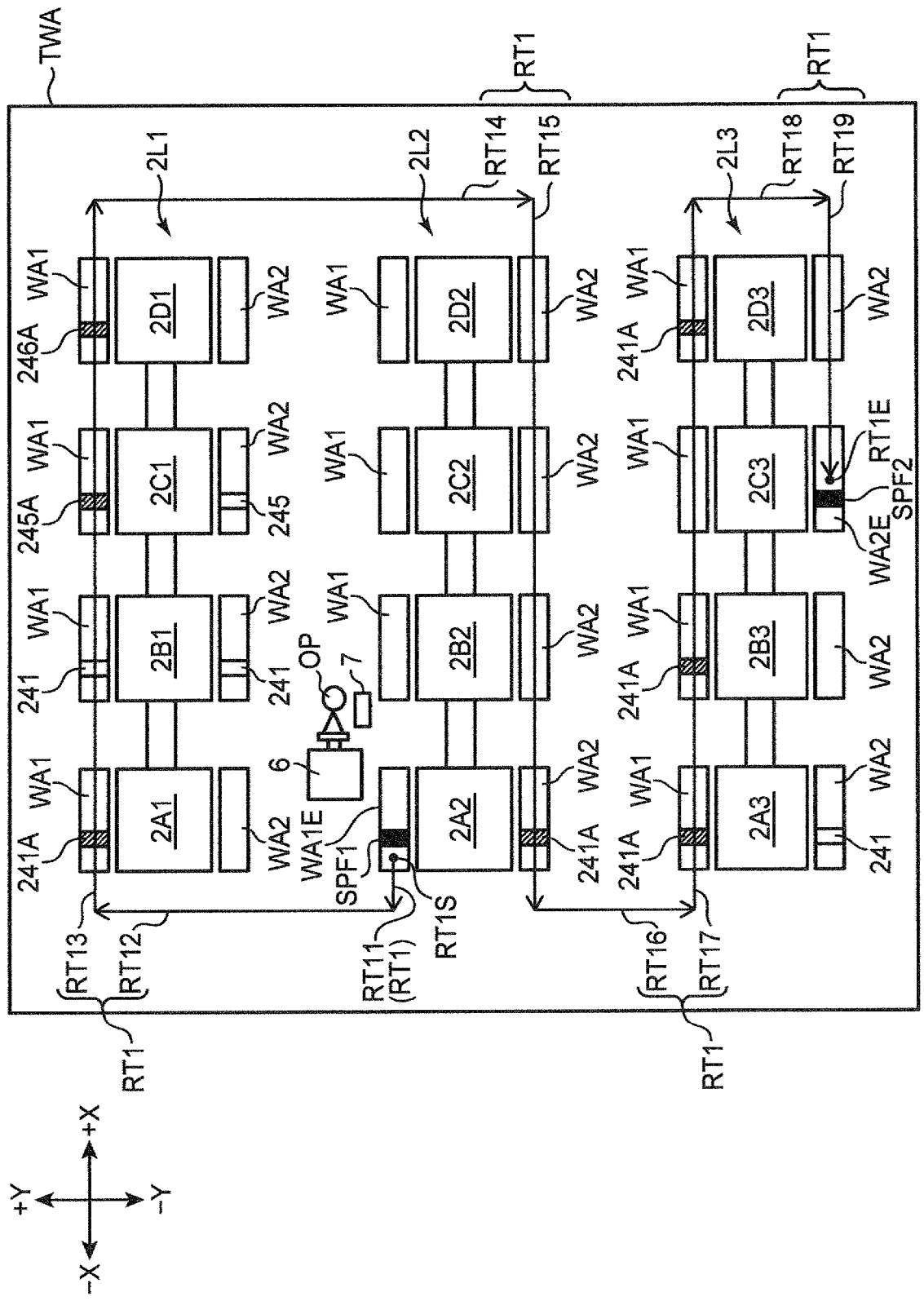
FIG. 14 is a diagram for describing control operation of a replenishment target extraction unit and a movement route setting unit in the component replenishment management system.
Figure 15:
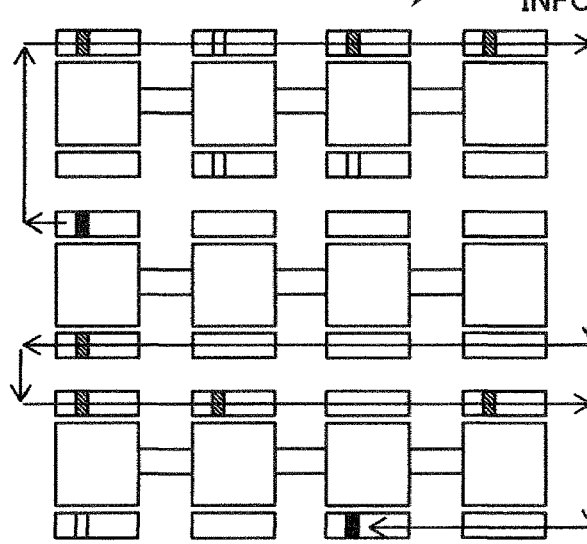
FIG. 15 is a diagram for describing work plan information generated by a work plan unit in the component replenishment management system.

FIG. 14 is a diagram for describing control operation of the replenishment target extraction unit 345 and the movement route setting unit 346. FIG. 15 is a diagram for describing work plan information JH5 generated by the work plan unit 347.

As shown in FIG. 14, a work area TWA is set on the component mounting lines 2L1, 2L2, and 2L3. The work area TWA represents a range in which one operator OP is in charge of the component replenishment work for the component supply device attached to each of the component mounters 2 of the component mounting lines 2L1, 2L2, and 2L3. The work area TWA includes the first and second work areas WA1 and WA2 set in the component mounter 2 disposed in the work area TWA.

Note that, in the example shown in FIG. 14, in the work area TWA, the component mounting lines 2L1, 2L2, and 2L3 extending in a straight line along the X-axis direction are provided side by side in the Y-axis direction at intervals. Hereinafter, the component mounting lines are referred to as the first component mounting line 2L1, the second component mounting line 2L2, and the third component mounting line 2L3 in order from the +Y side to the −Y side. In the first component mounting line 2L1, four of the component mounters 2 are connected and indicated as a first component mounter 2A1, a second component mounter 2B1, a third component mounter 2C1, and a fourth component mounter 2D1 in order from the −X side to the +X side. The first to fourth component mounters 2A1, 2B1, 2C1, and 2D1 are collectively referred to as the component mounters 2. In the second component mounting line 2L2, four of the component mounters 2 are connected and indicated as a first component mounter 2A2, a second component mounter 2B2, a third component mounter 2C2, and a fourth component mounter 2D2 in order from the −X side to the +X side. The first to fourth component mounters 2A2, 2B2, 2C2, and 2D2 are collectively referred to as the component mounters 2. In the third component mounting line 2L3, four of the component mounters 2 are connected and indicated as a first component mounter 2A3, a second component mounter 2B3, a third component mounter 2C3, and a fourth component mounter 2D3 in order from the −X side to the +X side. The first to fourth component mounters 2A3, 2B3, 2C3, and 2D3 are collectively referred to as the component mounters 2.

The operator OP carries the mobile terminal device 7, and, in the work area TWA, performs the component replenishment work in each of the work areas WA1 and WA2 by moving, by pushing a cart 6, on a movement route RT1 that passes through the first and second work areas WA1 and WA2 of each of the component mounters 2 and is set by the movement route setting unit 346 described later. Note that the cart 6 has a cargo portion capable of accommodating an article for the component replenishment work. The articles accommodated in the cargo portion include a new component storage member (reel, pallet, or stick) necessary for the component replenishment work, a collected product recovered after the component replenishment work, and the like. Further, the cart 6 may be unmanned transported by using an automated guided vehicle (AGV) which is an unmanned guided vehicle. In this case, the AGV instruction data created based on the work plan information JH5 described later is distributed to the AGV. The AGV instruction data is a file in which positions of the work areas WA1 and WA2 at which the AGV should stop, stop time, and the like are described. In the work area TWA, the AGV sequentially moves to and stops at each of the work areas WA1 and WA2 along the movement route RT1 so as to guide the operator OP. In this manner, the operator OP can move along the movement route RT1 with the AGV as a mark, and perform the component replenishment work in the work areas WA1 and WA2 at the position where the AGV is stopped. Further, the mobile terminal device 7 carried by the operator OP is connected to the mounting control device 20 of each of the component mounters 2 and the component replenishment management system 3 in a data communicable manner.

<Regarding Component Supply Monitoring Unit>

The component supply monitoring unit 341 will be described mainly with reference to FIGS. 12 and 13. FIG. 12 shows an example in which the component is supplied from three AFs 241A, 241B, and 241C, one tray feeder 245A, one stick feeder 246A, and two splicing feeders SPF1 and SPF2 among a plurality of component supply devices provided in each of the component mounters 2 of the first to third component mounting lines 2L1, 2L2, and 2L3 to produce the component mounting substrate. The component replenishment work that the operator OP is to perform according to the production of the component mounting substrate includes the component replenishment work for replenishing each of the AFs 241A, 241B, and 241C with a new reel for replenishment, the component replenishment work for replenishing the tray feeder 245A with a new pallet for replenishment, the component replenishment work for replenishing the stick feeder 246A with a new stick for replenishment, and splicing work for the first and second splicing feeders SPF1 and SPF2. Note that, the AFs 241A, 241B, and 241C, the tray feeder 245A, and the stick feeder 246A will be referred to as "component supply devices 241, 245, and 246 in the first replenishment system" when referred to collectively, and the first and second splicing feeders SPF1 and SPF2 will be referred to as "component supply devices SPFs in the second replenishment system" when referred to collectively. Further, the reel, pallet, and stick will be referred to as "component storage members" when referred to collectively.

First, the component supply monitoring unit 341 acquires a management start time TS indicating a management start time of a plan of the component replenishment work for each of the component supply devices 241, 245, and 246 in the first replenishment system and the component supply devices SPFs in the second replenishment system. The component supply monitoring unit 341 may acquire a time to start the production of the component mounting substrate as the management start time TS, or, in a case where command information for instructing the management start is input via the operation unit 32, may acquire a time at which the command information is input as the management start time TS.

Upon acquiring the management start time TS, the component supply monitoring unit 341 monitors, from the management start time TS, a supply state in each of the component supply devices 241, 245, and 246 in the first replenishment system and the component supply devices SPFs in the second replenishment system. For the component supply devices 241, 245, and 246 in the first replenishment system, the component supply monitoring unit 341 identifies a replenishable time zone that represents a time zone in which the component replenishment work can be performed for each of the component supply devices 241, 245, and 246. In the example shown in FIG. 12, a replenishable time zone TWSA is identified for the AF 241A, a replenishable time zone TWSB is identified for the AF 241B, and a replenishable time zone TWSC is identified for the AF 241C. Further, a replenishable time zone TWSD is identified for the tray feeder 245A, and a replenishable time zone TWSE is identified for the stick feeder 246A.

The most early time in each of the replenishable time zones TWSA to TWSE (hereinafter referred to as the "earliest time") is a time when a preceding component storage member, for which component supply is performed first, among the plurality of component storage members mounted in the component supply devices 241, 245, and 246 in the first replenishment system runs out of the component. When the preceding component storage member runs out of the component, a new component storage member for replenishment can be replenished. That is, when identifying each of the replenishable time zones TWSA to TWSE, the component supply monitoring unit 341 estimates, for each of the component supply devices 241, 245, and 246, replenishable time TT (see FIG. 13) representing time from the management start time TS until the component replenishment work for replenishing with a new component storage member for replenishment becomes possible. Replenishable time information J43, which represents the replenishable time TT for each of the component supply devices 241, 245, and 246 estimated by the component supply monitoring unit 341, is included in the component supply monitoring information JH4 (FIG. 13) described later.

In the example shown in FIG. 12, replenishable time TTA1 is estimated as time from the management start time TS to a time TA1 when the preceding reel runs out of the component for the AF 241A, replenishable time TTB1 is estimated as time from the management start time TS to a time TB1 when the preceding reel runs out of the component for the AF 241B, and replenishable time TTC1 is estimated as time from the management start time TS to a time TC1 when the preceding reel runs out of the component for the AF 241C. Further, replenishable time TTD1 is estimated as time from the management start time TS to a time TD1 when the preceding pallet runs out of the component for the tray feeder 245A, and replenishable time TTE1 is estimated as time from the management start time TS to a time TE1 when the preceding stick runs out of the component for the stick feeder 246A.

Further, the most late time in each of the replenishable time zones TWSA to TWSE (hereinafter referred to as the "latest time") is a time when the total number of remaining components in the plurality of component storage members mounted in the component supply devices 241, 245, and 246 in the first replenishment system reaches the predetermined component remaining number warning value. In order to prevent the supply of the component from the component supply devices 241, 245, and 246 from being stopped, when the total number of remaining components of the plurality of component storage members reaches the component remaining number warning value, the component replenishment work for replenishing with a new component storage member for replenishment needs to be performed. That is, when identifying each of the replenishable time zones TWSA to TWSE, the component supply monitoring unit 341 estimates, for each of the component supply devices 241, 245, and 246, component replenishment time limit WT (see FIG. 13) representing time until the total number of remaining components reaches the component remaining number warning value and the component replenishment work is required to be performed. The component replenishment time limit WT for each of the component supply devices 241, 245, and 246 estimated by the component supply monitoring unit 341 represents a time limit that is time longer than the replenishable time TT and until the component replenishment work is required to be performed. Component replenishment time limit information J44 indicating the component replenishment time limit WT is included in the component supply monitoring information JH4 (FIG. 13) described later.

In the example shown in FIG. 12, a component replenishment time limit WTA1 is estimated as time from the management start time TS to a time TA2 when the component replenishment work is required to be performed for the AF 241A, a component replenishment time limit WTB1 is estimated as time from the management start time TS to a time TB2 when the component replenishment work is required to be performed for the AF 241B, and a component replenishment time limit WTC1 is estimated for the AF 241C. Further, a component replenishment time limit WTD1 is estimated as time from the management start time TS to a time TD2 when the component replenishment work is required to be performed for the tray feeder 245A, and a component replenishment time limit WTE1 is estimated as time from the management start time TS to a time TE2 when the component replenishment work is required to be performed for the stick feeder 246A.

The component supply monitoring unit 341 identifies the replenishable time zones TWSA to TWSE for each of the component supply devices 241, 245, and 246 in the first replenishment system based on the attachment information JH1 from the mounting control device 20 of each of the component mounters 2, the production plan information JH2 from the production plan management device 4, and the substrate information JH3 from the substrate information management device 5, which are information provided from the communication unit 31 to the control unit 34.

Specifically, the component supply monitoring unit 341 first obtains the number of remaining components in the preceding component storage member based on the preceding component remaining number information J15 of the attachment information JH1. Furthermore, the component supply monitoring unit 341 obtains the number of components used per second by dividing a required number for each component identified by the component type information J14 necessary for the production of one component mounting substrate, which is represented by the component required number information J31 of the substrate information JH3 by time required to finish one component mounting substrate for each substrate identified by the substrate type information J22, which is represented by the cycle time information J24 of the production plan information JH2. Then, the component supply monitoring unit 341 obtains the earliest time in each of the replenishable time zones TWSA to TWSE by dividing the number of remaining components in the preceding component storage member by the number of the components used per second. On the other hand, the component supply monitoring unit 341 obtains the latest time in each of the replenishable time zones TWSA to TWSE by dividing the number of components obtained by subtracting the component remaining number warning value represented by the component remaining number warning value information J17 from the total number of remaining components represented by the total component remaining number information J16 by the number of the components used per second.

The number of remaining components in the preceding component storage member represented by the preceding component remaining number information J15 and the total number of remaining components represented by the total component remaining number information J16 are reduced every time the component is taken out by the head unit 25. Although details will be described later, every time the component is taken out from the preceding component storage member, the preceding component remaining number information J15 is updated. Further, when the preceding component storage member runs out of the component and the component supply devices 241, 245, and 246 in the first replenishment system are replenished with a new component storage member for replenishment, the number of the components stored in the new component storage member for replenishment (initial setting number) is added to the total number of remaining components that changes every time the component is taken out by the head unit 25, so that the total number of remaining components is updated. The number of components stored in a new component storage member for replenishment (initial setting number) is stored in the ROM or the like of the control unit 34 for each component identified by the component type information J14. Note that, in a case where the component storage member in use is used as a new component storage member for replenishment, the initial setting number stored in the ROM or the like of the control unit 34 is rewritten with an actual number of components stored in the component storage member.

The component supply monitoring unit 341 updates an identification result of the replenishable time zone TWSA to TWSE in a predetermined cycle (for example, a cycle of 30 seconds) in response to the update of the preceding component remaining number information J15 and the total component remaining number information J16. Further, the component supply monitoring unit 341 may be configured to identify the replenishable time zones TWSA to TWSE in the production of the first substrate type, or identify the replenishable time zones TWSA to TWSE in consideration of the production of the second and subsequent substrate types in addition to the first substrate type.

Furthermore, by monitoring the supply state of the component in each of the component supply devices SPFs in the second replenishment system, the component supply monitoring unit 341 estimates the component replenishment time limit WT (see FIG. 13) that represents time until the splicing work as the component replenishment work is required to be performed for each of the component supply devices SPFs. The component replenishment time limit WT for each of the component supply devices SPFs in the second replenishment system represents a time limit from the management start time TS until the splicing work is required to be performed. The component replenishment time limit WT for each of the component supply devices SPFs in the second component replenishment type is also registered in the component replenishment time limit information J44 included in the component supply monitoring information JH4 described later.

In the example shown in FIG. 12, for the first splicing feeder SPF1, a component replenishment time limit WTS1 is estimated as time from the management start time TS to a time TS1 when the splicing work is required to be performed. For the second splicing feeder SPF2, a component replenishment time limit WTS2 is estimated as time from the management start time TS to a time TS2 when the splicing work is required to be performed.

The component supply monitoring unit 341 generates the component supply monitoring information JH4 shown in FIG. 13 as information representing a monitoring result of a supply state of the component in the component supply devices 241, 245, and 246 in the first replenishment system and the component supply devices SPFs in the second replenishment system. The component supply monitoring information JH4 is information, in which component mounting line name information J41, the mounter type information J11, work area information J42, the set position information J12, the device type information J13, the replenishable time information J43, the component replenishment time limit information J44, and work standard time information J45 are associated.

The component mounting line name information J41 is information for identifying the first to third component mounting lines 2L1, 2L2, and 2L3 in the work area TWA. The work area information J42 is information for identifying the work areas WA1 and WA2 set in the component mounter 2 represented by the mounter type information J11.

The replenishable time information J43 is information representing the replenishable time TT in each of the component supply devices 241, 245, and 246 in the first replenishment system, the replenishable time TT being estimated by the component supply monitoring unit 341. More specifically, the replenishable time information J43 represents the replenishable time TT until the component replenishment work for replenishing with a new component storage member for replenishment becomes possible for the component supply devices 241, 245, and 246 in the first replenishment system disposed at the set position represented by the set position information J12 in the work areas WA1 and WA2 represented by the work area information J42. The replenishable time TT changes according to the total number of remaining components stored in the plurality of component storage members mounted on the component supply devices 241, 245, and 246 in the first replenishment system. For this reason, the replenishable time information J43 is updated in a predetermined cycle (for example, a cycle of 30 seconds) in response to the update of the total component remaining number information J16 representing the total number of remaining components included in the attachment information JH1. Note that, regarding the component supply devices SPFs in the second replenishment system, the splicing work (component replenishment work) becomes possible at a time point at which the preceding component storage tape runs out of the component and the component replenishment time limit WT is reached. Accordingly, time equivalent to the component replenishment time limit WT is registered in the replenishable time information J43.

The component replenishment time limit information J44 is information representing the component replenishment time limit WT in each of the component supply devices 241, 245, and 246 in the first replenishment system and the component supply devices SPFs in the second replenishment system, the component replenishment time limit WT being estimated by the component supply monitoring unit 341. More specifically, the component replenishment time limit information J44 represents the component replenishment time limit WT until the component replenishment work is required to be performed in the component supply device disposed at the set position represented by the set position information J12. The component replenishment time limit information J44 changes according to the total number of remaining components represented by the total component remaining number information J16. For this reason, the component replenishment time limit information J44 is updated in a predetermined cycle (for example, a cycle of 30 seconds) in response to the update of the total component remaining number information J16.

The work standard time information J45 is information representing work standard time WS required from the start to the end of the component replenishment work for each of the component supply devices 241, 245, and 246 in the first replenishment system and the component supply devices SPFs in the second replenishment system. The work standard time WS represented by the work standard time information J45 is set for each work type of the component replenishment work. For example, the work standard time of the component replenishment work for replenishing the AF 241 with a new reel for replenishment is set to "30 seconds". The work standard time of the component replenishment work for replenishing the tray feeder 245 with a new pallet for replenishment is set to, for example, "50 seconds". The work standard time of the component replenishment work for replenishing the stick feeder 246 with a new stick for replenishment is set to, for example, "45 seconds". Further, the work standard time of the splicing work for the splicing feeder SPF is set to "90 seconds", for example. Note that the work standard time represented by the work standard time information J45 may be added with a weighting coefficient according to the work ability of the operator OP for each piece of the component replenishment work.

<Regarding Emergency Device Extraction Unit>

Next, based on the component replenishment time limit WT represented by the component replenishment time limit information J44 included in the component supply monitoring information JH4, the emergency device extraction unit 342 extracts top two component supply devices having highest degree of emergency for performing the component replenishment work as a first emergency device and a second emergency device. The emergency device extraction unit 342 extracts, in the order of shorter component replenishment time limit WT, the component supply device with the shortest component replenishment time limit WT as the first emergency device and the component supply device with the second shortest component replenishment time limit WT as the second emergency device. In the example shown in FIG. 12, among the AFs 241, 241B, and 241C, the tray feeder 245A, and the stick feeder 246A in the first replenishment system, and the first and second splicing feeders SPF1 and SPF2 in the second replenishment system, the first splicing feeder SPF1 corresponding to the shortest component replenishment time limit WTS1 is extracted as the first emergency device, and the second splicing feeder SPF2 corresponding to the second shortest component replenishment time limit WTS2 is extracted as the second emergency device.

As described above, in the first and second splicing feeders SPF1 and SPF2 in the second replenishment system, the splicing work needs to be performed as the component replenishment work immediately before the component storage tape runs out of the component, that is, immediately before the component replenishment time limit WT is reached. For this reason, a performing timing of the component replenishment work for the first and second splicing feeders SPF1 and SPF2 in the second replenishment system is restricted to immediately before the preceding component storage tape runs out of the component, and the degree of freedom in time is low. When the component replenishment work for the first and second splicing feeders SPF1 and SPF2 in the second replenishment system becomes possible, it is immediately before the component replenishment time limit WT is reached. That is, the first and second splicing feeders SPF1 and SPF2 in the second replenishment system are always immediately before the component replenishment time limit WT is reached at a timing at which the component replenishment work becomes possible, and are likely to become the first and second emergency devices having high degree of emergency for performing the component replenishment work. As a matter of course, in a case where the component replenishment time limit WT of the component supply devices 241, 245, and 246 in the first replenishment system is shorter than the first and second splicing feeders SPF1 and SPF2 in the second replenishment system, the component supply devices 241, 245, and 246 in the first replenishment system may also be the first and second emergency devices.

In the example shown in FIG. 14, the first splicing feeder SPF1 disposed in the first work area WA1 of the first component mounter 2A2 in the second component mounting line 2L2 is extracted as the first emergency device. The first work area WA1 of the first component mounter 2A2 in the second component mounting line 2L2 in which the first splicing feeder SPF1 as the first emergency device is disposed is a first emergency work area WA1E. Further, in the example shown in FIG. 14, the second splicing feeder SPF2 disposed in the second work area WA2 of the third component mounter 2C3 in the third component mounting line 2L3 is extracted as the second emergency device. The second work area WA2 of the third component mounter 2C3 in the third component mounting line 2L3 in which the second splicing feeder SPF2 as the second emergency device is disposed is a second emergency work area WA2E.

<Regarding Emergency Time Setting Unit>

Next, as shown in FIG. 12, the emergency time setting unit 343 sets, as a first emergency time, the time TS1 at which the splicing work (component replenishment work) is to be performed for the first splicing feeder SPF1 as the first emergency device, and sets, as a second emergency time, the time TS2 at which the splicing work (component replenishment work) is to be performed for the second splicing feeder SPF2 as the second emergency device. Then, the emergency time setting unit 343 sets, as an emergency time zone WET, a time zone from the time TS1 as the first emergency time to the time TS2 as the second emergency time.

<Regarding Replenishable Device Identification Unit>

Next, the replenishable device identification unit 344 identifies, as a replenishable device, a plurality of component supply devices that can be replenished with a new component storage member for replenishment within the emergency time zone WET. In the example shown in FIG. 12, among the AFs 241A, 241B, and 241C, the tray feeder 245A, and the stick feeder 246A other than the first and second splicing feeders SPF1 and SPF2 extracted as the first and second emergency devices by the emergency device extraction unit 342, the component supply device whose earliest time of the replenishable time zone is included in the range of the emergency time zone WET is identified as the replenishable device.

More specifically, since the earliest time TA1 of the replenishable time zone TWSA of the AF 241A is included in the range of the emergency time zone WET, this AF 241A is identified as a replenishable device. Since the earliest time TB1 of the replenishable time zone TWSB of the AF 241B is included in the range of the emergency time zone WET, this AF 241B is identified as a replenishable device. Since the earliest time TC1 of the replenishable time zone TWSC of the AF 241C is not included in the range of the emergency time zone WET, this AF 241B is not identified as a replenishable device. Since the earliest time TD1 of the replenishable time zone TWSD of the tray feeder 245A is included in the range of the emergency time zone WET, this tray feeder 245A is identified as a replenishable device. Since the earliest time TE1 of the replenishable time zone TWSE of the stick feeder 246A is included in the range of the emergency time zone WET, this stick feeder 246A is identified as a replenishable device.

Further, in the example shown in FIG. 14, in the first component mounting line 2L1, the AF 241A disposed in the first work area WA1 of the first component mounter 2A1, the AFs 241 disposed in the first and second work areas WA1 and WA2 of the second component mounter 2B1, the tray feeders 245A and 245 disposed in the first and second work areas WA1 and WA2 of the third component mounter 2C1, and the stick feeder 246A disposed in the first work area WA1 of the fourth component mounter 2D1 are identified as a replenishable device. On the other hand, in the first component mounting line 2L1, the second work area WA2 of the first component mounter 2A1 and the second work area WA2 of the fourth component mounter 2D1 do not have a replenishable device, and are set as a non-work target area which is an area excluded from the target of the component replenishment work.

Furthermore, in the second component mounting line 2L2, the AF 241A disposed in the second work area WA2 of the first component mounter 2A2 is identified as a replenishable device. On the other hand, in the second component mounting line 2L2, the first and second work areas WA1 and WA2 of the second component mounter 2B2, the third component mounter 2C2, and the fourth component mounter 2D2 do not have a replenishable device, and are set as a non-work target area which is an area excluded from the target of the component replenishment work.

Furthermore, in the third component mounting line 2L3, the AFs 241A and 241 disposed in the first and second work areas WA1 and WA2 of the first component mounter 2A3, the AF 241A disposed in the first work area WA1 of the second component mounter 2B3, and the AF 241A disposed in the first work area WA1 of the fourth component mounter 2D3 are identified as a replenishable device. On the other hand, in the third component mounting line 2L3, the second work area WA2 of the second component mounter 2B3, the first work area WA1 of the third component mounter 2C3, and the second work area WA2 of the fourth component mounter 2D3 do not have a replenishable device, and are set as a non-work target area which is an area excluded from the target of the component replenishment work.

<Regarding Replenishment Target Extraction Unit>

Next, the replenishment target extraction unit 345 extracts, from among a plurality of replenishable devices identified by the replenishable device identification unit 344, a replenishment target device that is a target of the component replenishment work within the range of the emergency time zone WET. In the example shown in FIG. 14, in the first component mounting line 2L1, the AF 241A disposed in the first work area WA1 of the first component mounter 2A1, the tray feeder 245A disposed in the first work area WA1 of the third component mounter 2C1, and the stick feeder 246A disposed in the first work area WA1 of the fourth component mounter 2D1 are extracted as a replenishment target device. Furthermore, in the second component mounting line 2L2, the AF 241A disposed in the second work area WA2 of the first component mounter 2A2 is extracted as a replenishment target device. Furthermore, in the third component mounting line 2L3, the AF 241A disposed in the first work area WA1 of the first component mounter 2A3, the AF 241A disposed in the first work area WA1 of the second component mounter 2B3, and the AF 241A disposed in the first work area WA1 of the fourth component mounter 2D3 are extracted as a replenishment target device.

As described above, the first and second splicing feeders SPF1 and SPF2 in the second replenishment system are always immediately before the component replenishment time limit WT is reached at a timing at which the component replenishment work becomes possible, and are likely to become the first and second emergency devices having high degree of emergency for performing the component replenishment work. On the other hand, for the component supply devices 241, 245, and 246 in the first replenishment system that can mount a plurality of the component storage members, the component replenishment work for replenishing with the component storage member for replenishment can be performed in a state where the component can be supplied from the subsequent component storage member even if the preceding component storage member runs out of the component. For this reason, the timing of performing the component replenishment work for the component supply devices 241, 245, and 246 in the first replenishment system is not restricted to a time point at which the preceding component storage member runs out of the component as in the second replenishment system, and there is higher degree of freedom in time as compared to the second replenishment system. When the component replenishment work for the component supply devices 241, 245, and 246 in the first replenishment system becomes possible, the component can be supplied from the subsequent component storage member, and there is enough time until the component replenishment time limit WT is reached. For this reason, the component supply devices 241, 245, and 246 in the first replenishment system can be handled appropriately as a replenishment target device that is a target of the component replenishment work within the range of the emergency time zone WET that defines a time of the component replenishment work for the first and second emergency devices.

In the component replenishment management system 3, among the component supply devices provided side by side in the work areas WA1 and WA2 set in the component mounters 2 of the first to third component mounting lines 2L1, 2L2, and 2L3, the first and second emergency devices having high degree of emergency for performing the component replenishment work are extracted by the emergency device extraction unit 342. The operator OP can perform the component replenishment work for the first emergency device (first splicing feeder SPF1) with the first emergency time TS1 (FIG. 12) as a guide, and perform the component replenishment work for the second emergency device (second splicing feeder SPF2) with the second emergency time TS2 (FIG. 12) as a guide.

Furthermore, in the component replenishment management system 3, the replenishment target extraction unit 345 extracts a replenishment target device that is a target of the component replenishment work within the range of the emergency time zone WET from the first emergency time TS1 to the second emergency time TS2. In this manner, within the range of the emergency time zone WET which is a timing of performing the component replenishment work for the first and second emergency devices, "collective replenishment" becomes possible, in which the operator OP performs the component replenishment work collectively for a replenishment target device which is a target of the component replenishment work. For this reason, the frequency of the operator OP going to the component mounter 2 in which the component supply devices are provided in parallel can be lowered to reduce the load of the component replenishment work by the operator OP, and the efficiency of the component replenishment work can be improved.

In the present embodiment, the replenishment target extraction unit 345 extracts a replenishment target device based on the work standard time information J45 included in the component supply monitoring information JH4 generated by the component supply monitoring unit 341. Specifically, based on the work standard time WS represented by the work standard time information J45, the replenishment target extraction unit 345 extracts as many replenishment target devices as possible for which the component replenishment work can be performed within the range of the emergency time zone WET. The replenishment target extraction unit 345 extracts replenishment target devices such that the total time of the work standard time WS is equal to or less than the time interval of the emergency time zone WET. Next, based on the component replenishment time limit WT represented by the component replenishment time limit information J44 included in the component supply monitoring information JH4, the replenishment target extraction unit 345 extracts replenishment target devices in descending order of priority of performing the component replenishment work. Specifically, the replenishment target extraction unit 345 recognizes that a replenishable device with the component replenishment time limit WT that is shorter has a higher priority of performing the component replenishment work, and extracts replenishment target devices in order from ones with the component replenishment time limit WT that is shorter. In this manner, the operator OP can perform the component replenishment work with high priority based on the component replenishment time limit WT within the range of the emergency time zone WET.

<Regarding Movement Route Setting Unit>

Next, the movement route setting unit 346 sets the movement route RT1 of the operator OP in the work area TWA, as shown in FIG. 14. Before performing the component replenishment work in the work area TWA, the operator OP performs preparatory work for placing an article (reel, pallet, stick, or the like) for the component replenishment work on a cargo portion of the cart 6 in, for example, a component warehouse. When the operator OP performs the preparatory work in the component warehouse as described above, the movement route setting unit 346 preferably sets the movement route RT1. This is because the movement route RT1, which passes through the entire work area TWA, passes near the component warehouse somewhere along the route. Further, in a case where the preparatory work for the article for the component replenishment work in the component warehouse is desirably performed first, a movement route is preferably set such that the component warehouse becomes a start point of the route. The movement route setting unit 346 sets the movement route RT1 having the first emergency work area WA1E, which is the work area where the first splicing feeder SPF1 as the first emergency device is disposed, as a start point RT1S, and the second emergency work area WA2E, which is the work area where the second splicing feeder SPF2 as the second emergency device is disposed, as an end point RT1E.

The operator OP can perform the component replenishment work (splicing work) for the first splicing feeder SPF1 as the first emergency device in the first emergency work area WA1E, which is the start point RT1S of the movement route RT1 set by the movement route setting unit 346, and can perform the component replenishment work (splicing work) for the second splicing feeder SPF2 as the second emergency device in the second emergency work area WA2E, which is the end point RT1E of the movement route RT1. Then, while moving on the movement route RT1 from the start point RT1S to the end point RT1E, the operator OP can perform the component replenishment work for the replenishment target device to be performed within the range of the emergency time zone WET. By moving along the movement route RT1, the operator OP can efficiently perform the component replenishment work for the first and second emergency devices and the replenishment target device while reducing unnecessary movement.

In the present embodiment, the movement route setting unit 346 sets, as the movement route of the operator OP, the first route RT1 that passes through all the work areas WA1 and WA2 in which the replenishment target devices extracted by the replenishment target extraction unit 345 are disposed between the start point RT1S and the end point RT1E. In the example shown in FIG. 14, the first route RT1 set by the movement route setting unit 346 passes through all of the first work areas WA1 of the first component mounter 2A1, the third component mounter 2C1, and the fourth component mounter 2D1 where the AF 241A, the tray feeder 245A, and the stick feeder 246A as replenishment target devices in the first component mounting line 2L1 are disposed, the second work area WA2 of the first component mounter 2A2 where the AF 241A as the replenishment target device in the second component mounting line 2L2 is disposed, and the first work areas WA1 of the first component mounter 2A3, the second component mounter 2B3, and the fourth component mounter 2D3 where the AF 241A as replenishment target devices in the third component mounting line 2L3 are disposed. At each of the start point RT1S and the end point RT1E of the first route RT1 as the movement route, the operator OP can perform the component replenishment work for the first and second emergency devices (first and second splicing feeders SPF1 and SPF2). Then, while moving on the first route RT1 from the start point RT1S to the end point RT1E, the operator OP can perform the component replenishment work for all the replenishment target devices that can be performed within the range of the emergency time zone WET.

Further, as shown in FIG. 14, it is desirable that the movement route setting unit 346 set the first route RT1 that is continuous in a single stroke without an intersection as the movement route of the operator OP. The first route RT1 that is continuous in a single stroke is a route that does not pass a route portion that the route has passed once in the opposite direction again. The operator OP can move along the first route RT1 having a simple shape of a single stroke and perform the component replenishment work for the first and second emergency devices on the first route RT1 and the replenishment target device. Further, in a case where a movement route is set, which passes through all of the work areas WA1 and WA2 in which the replenishment target device extracted by the replenishment target extraction unit 345 is disposed, when a non-work target area in which the replenishable device is not disposed is set as a movement route, for example, a route length of the movement route may become long. In view of the above, in a case where a non-work target area in which the replenishable device is not disposed exists, it is desirable that the movement route setting unit 346 set, as the first route RT1, a route that does not pass through the non-work target area within a range where the route can be provided in a single stroke without an intersection. In this manner, a route length of the movement route of the operator OP can be shortened.

Note that, when a route that is a basic route of the first route RT1 and passes through all the work areas WA1 and WA2 of all the component mounters in the work area TWA is referred to as an all device passing route, a route that is directed from the −X side to the +X side in all the first work areas WA1 of the first component mounter 2A1 using the first work area WA1 of the first component mounting line 2L1 as the start point in FIG. 14, then directed from the +X side to the −X side in all the second work areas WA2 of the first component mounting line 2L1, and then directed from the −X side to the +X side in all the first work areas WA1 of the second component mounting line 2L2, similarly passes in the arrangement order in a direction from the +Y side to the −Y side of all the first work areas WA1 on the +Y side and all the second work areas WA2 on the −Y side of each of the component mounting lines arranged in the Y-axis direction, and finally extends from the +X side to the −X side along all the second work areas WA2 of the third component mounting line 2L3 is conceivable as an example of the all device passing route. This all device passing route is continuous in a single stroke from the first work area WA1 of the first component mounter 2A1 that is the start point of the route to the second work area WA2 of the first component mounter 2A3 that is the end point, and does not pass a route portion that the route has passed once in the opposite direction again.

Alternatively, a route that goes backward using the end point of this route as the start point is also an example of the all device passing route. A similar route that first goes to the −X side with the start point as the first work area WA1 of the fourth component mounter 2D1 is also an example of the all device passing route. Such an all device passing route can be selected as the first route RT1. For example, in a case where the first emergency device is in a region other than the first work area WA1 of the first component mounter 2A1, a route that passes directly from the first emergency device to the first component mounter 2A1 is added to the all device passing route starting from the first work area WA1 of the first component mounter 2A1, and a route directed to the second emergency device is further added after the second work area WA2 of the first component mounter 2A3 at the end point to form the first route RT1. In this case, if the component warehouse is installed in the vicinity of the first work area WA1 of the first component mounter 2A1, it is possible to start the component replenishment work after performing the preparation work for the article for the component replenishment work in the component warehouse.

Further, a route using a work area in the middle of the above-mentioned all device passing route as the start point, passing through a route similar to the one described above, and using a point before the start point as the end point is also an example of the all device passing route. That is, the route returns to the first work area WA1 of the first component mounter 2A1 which is the start point of the above-mentioned all device passing route after the second work area WA2 of the first component mounter 2A3 which is the end point of the above-mentioned all device passing route, and then uses a work area before the set start point as the end point.

Further, in a case where the first route RT1 is tentatively determined in this way, and the replenishment target device is not present on the route before the second work area WA2 of the first component mounter 2A3 at the end point on the route, a route directed to the second emergency device after performance of the component replenishment work for the last replenishment target device may be set as the first route RT1.

A route including such an all device passing route is used as the basis, and, for example, like the first route RT1 in FIG. 14, the route may be shortened for direct movement from a location in the middle of the route to another location in the middle of the route without passing through a work area in which a component supply device itself, such as an AF, a tray feeder, a stick feeder, or the like that may be a replenishable device, is not disposed, or a work area in which, while component supply devices that may be a replenishable device are disposed, any of these component supply devices is not in a replenishable state, or the setting may be such that only a route that passes all the work areas WA1 and WA2 of all the component mounters in the work area TWA is set as the first route RT1 and the route is not shortened any more than that.

In the example shown in FIG. 14, the first route RT1 set by the movement route setting unit 346 is a route that does not pass through each of the second work areas WA2 on the −Y side of the first to fourth component mounters 2A1, 2B1, 2C1, and 2D1 in the first component mounting line 2L1, where none of the first and second emergency devices and the replenishment target device is disposed. Then, the first route RT1 is a route that is continuous in a single stroke without an intersection, the route including a first straight route portion RT11, a first connecting route portion RT12, a second straight route portion RT13, a second connecting route portion RT14, a third straight route portion RT15, a third connecting route portion RT16, a fourth straight route portion RT17, a fourth connecting route portion RT18, and a fifth straight route portion RT19.

The first straight route portion RT11 is a straight route portion extending from the first work area WA1E (first emergency work area) of the first component mounter 2A2 in the second component mounting line 2L2 where the first splicing feeder SPF1 as the first emergency device is disposed toward an end portion on the −X side of the second component mounting line 2L2. In the second component mounting line 2L2, each of the first work areas WA1 of the second to fourth component mounters 2B2, 2C2, and 2D2 disposed on the +X side with respect to the first component mounter 2A2 is a non-work target area where a replenishable device is not disposed. For this reason, the movement route setting unit 346 sets the first straight route portion RT11 extending from the first work area WA1E as the first emergency work area toward the end portion on the −X side to obtain a route that does not pass through each of the first work areas WA1 of the second to fourth component mounters 2B2, 2C2, and 2D2, which are non-work target areas in the second component mounting line 2L2.

The second straight route portion RT13 is a straight route portion that passes through all of the first work areas WA1 of the first to fourth component mounters 2A1, 2B1, 2C1, and 2D1 in the first component mounting line 2L1, and extends from an end portion on the −X side toward an end portion on the +X side along the first component mounting line 2L1. The second straight route portion RT13 passes through each of the first work areas WA1 of the first component mounter 2A1, the third component mounter 2C1, and the fourth component mounter 2D1 where the AF 241A, the tray feeder 245A, and the stick feeder 246A as replenishment target devices in the first component mounting line 2L1 are disposed.

The third straight route portion RT15 is a straight route portion that passes through all of the second work areas WA2 of the first to fourth component mounters 2A2, 2B2, 2C2, and 2D2 in the second component mounting line 2L2, and extends from an end portion on the +X side toward an end portion on the −X side along the second component mounting line 2L2. The third straight route portion RT15 passes through the second work area WA2 of the first component mounter 2A2 in which the AF 241A as a replenishment target device in the second component mounting line 2L2 is disposed. In the second component mounting line 2L2, each of the second work areas WA2 of the second to fourth component mounters 2B2, 2C2, and 2D2 disposed on the +X side with respect to the first component mounter 2A2 is a non-work target area where a replenishable device is not disposed. However, it is impossible to set a route in a single stroke that passes through the second work area WA2 of the first component mounter 2A2 in which the AF 241A as a replenishment target device is disposed and does not pass through the second work areas WA2 of the second to fourth component mounters 2B2, 2C2, and 2D2 which are non-work target areas. For this reason, the movement route setting unit 346 sets the third straight route portion RT15 that passes through a non-work target area and passes through the second work area WA2 of the first component mounter 2A2 in which the AF 241A as a replenishment target device is disposed.

The fourth straight route portion RT17 is a straight route portion that passes through all of the first work areas WA1 of the first to fourth component mounters 2A3, 2B3, 2C3, and 2D3 in the third component mounting line 2L3, and extends from an end portion on the −X side toward an end portion on the +X side along the third component mounting line 2L3. The fourth straight route portion RT17 passes through each of the first work areas WA1 of the first component mounter 2A3, the second component mounter 2B3, and the fourth component mounter 2D3 where the AF 241A as a replenishment target device in the third component mounting line 2L3 is disposed. In the third component mounting line 2L3, the first work area WA1 of the third component mounter 2C3 is a non-work target area where a replenishable device is not disposed. However, it is impossible to set a route in a single stroke that passes through the first work area WA1 of the first component mounter 2A3, the second component mounter 2B3, and the fourth component mounter 2D3 in which the AF 241A as a replenishment target device is disposed and does not pass through the first work area WA1 of the third component mounter 2C3 which is a non-work target area. For this reason, the movement route setting unit 346 sets the fourth straight route portion RT17 that passes through a non-work target area and passes through the first work area WA1 of the first component mounter 2A3, the second component mounter 2B3, and the fourth component mounter 2D3 in which the AF 241A as a replenishment target device is disposed.

The fifth straight route portion RT19 is a straight route portion extending from an end portion on the +X side of the third component mounting line 2L3 to the second work area WA2E (second emergency work area) of the third component mounter 2C3 where the second splicing feeder SPF2 as the second emergency device is disposed. In the third component mounting line 2L3, the second work area WA2 of the fourth component mounter 2D3 is a non-work target area where a replenishable device is not disposed. However, it is impossible to set a route in a single stroke that extends to the second work area WA2E of the third component mounter 2C3 where the second emergency device is disposed without passing through the second work area WA2 of the fourth component mounter 2D3 as a non-work target area. For this reason, the movement route setting unit 346 sets the fifth straight route portion RT19 that passes through the second work area WA2 of the fourth component mounter 2D3 which is the non-work target area and extends to the second work area WA2E of the third component mounter 2C3 where the second emergency device is disposed.

The first connecting route portion RT12 is a route portion that connects an end portion on the −X side of the first straight route portion RT11 and an end portion on the −X side of the second straight route portion RT13 on an outer side than a side edge on the −X side of the first component mounting line 2L1, and extends from the −Y side toward the +Y side. The second connecting route portion RT14 is a route portion that connects an end portion on the +X side of the second straight route portion RT13 and an end portion on the +X side of the third straight route portion RT15 on an outer side than a side edge on the +X side of the first and second component mounting lines 2L1 and 2L2, and extends from the +Y side toward the −Y side. The third connecting route portion RT16 connects an end portion on the −X side of the third straight route portion RT15 and an end portion on the −X side of the fourth straight route portion RT17, and extends from the +Y side toward the −Y side. The fourth connecting route portion RT18 is a route portion that connects an end portion on the +X side of the fourth straight route portion RT17 and an end portion on the +X side of the fifth straight route portion RT19 on an outer side than a side edge on the +X side of the third component mounting line 2L3, and extends from the +Y side toward the −Y side.

At each of the start point RT1S and the end point RT1E of the first route RT1 as the movement route, the operator OP can perform the component replenishment work for the first and second splicing feeders SPF1 and SPF2 as the first and second emergency devices. Furthermore, the operator OP can move along the first route RT1 having a simple shape of a single stroke and perform the component replenishment work for all replenishment target devices extracted by the replenishment target extraction unit 345 on the first route RT1.

<Regarding Work Plan Unit>

Next, the work plan unit 347 generates the work plan information JH5 shown in FIG. 15. The work plan information JH5 is information for notifying the operator OP of a work plan. The work plan information JH5 includes, for example, first emergency time information J51, second emergency time information J52, work list information J53, and movement route information J54.

The first emergency time information J51 is information that is set by the emergency time setting unit 343 and represents the first emergency time TS1 at which the component replenishment work is to be performed for the first emergency device. The second emergency time information J52 is information that is set by the emergency time setting unit 343 and represents the second emergency time TS2 at which the component replenishment work is to be performed for the second emergency device.

The work list information J53 is information that lists the component replenishment work to be performed by the operator OP. In the work list information J53, pieces of the component replenishment work to be performed by the operator OP are listed in order from the start point RT1S to the end point RT1E of the first route RT1 (movement route) of the operator OP. The work list information J53 is information in which, for example, the component mounting line name information J41, the mounter type information J11, the work area information J42, the set position information J12, the device type information J13, and the component type information J14 are associated.

The movement route information J54 is information representing a schematic image of the first route RT1 (movement route) set by the movement route setting unit 346.

The work plan information JH5 generated by the work plan unit 347 is displayed on the display unit 33 of the component replenishment management system 3. Furthermore, the work plan information JH5 is transmitted to the mounting control device 20 of each of the component mounters 2 and the mobile terminal device 7 carried by the operator OP via the communication unit 31. When the work plan information JH5 is input to the mounting control device 20 of each of the component mounters 2, the work plan information JH5 is displayed on the display unit 203 of the mounting control device 20. Further, when the work plan information JH5 is input to the mobile terminal device 7 carried by the operator OP, the work plan information JH5 is displayed on the mobile terminal device 7.

The operator OP can sequentially perform the component replenishment work represented by the work list information J53 by moving along the first route RT1 (movement route) represented by the movement route information J54 based on the work plan information JH5 displayed on the mobile terminal device 7 or the like. The operator OP preferably performs the component replenishment work for the first splicing feeder SPF1 (first emergency device) disposed in the first work area WA1 of the second component mounter 2A2 in the second component mounting line 2L2 registered at the top of the work list information J53 at the first emergency time TS1 represented by the first emergency time information J51. Furthermore, the operator OP preferably performs the component replenishment work for the second splicing feeder SPF2 (second emergency device) disposed in the second work area WA2 of the third component mounter 2C3 in the third component mounting line 2L3 registered at the bottom of the work list information J53 at the second emergency time TS2 represented by the second emergency time information J52.

Note that, in the device type information J13 included in the work list information J53 of the work plan information JH5, by registering the abbreviations of the component supply devices such as "SPF" and "AF" as information representing a type of a device corresponding to the second emergency device ("SPF" in the example shown in FIG. 15), the operator OP can flexibly perform the component replenishment work for the second emergency device based on the work plan information JH5 displayed on the mobile terminal device 7 or the like. That is, in a case where the second emergency device is the splicing feeder SPF in the second replenishment system, the component replenishment work (splicing work) needs to be performed at the second emergency time TS2, and the work cannot be performed earlier than the second emergency time TS2. On the other hand, in a case where the second emergency device is the component supply device in the first replenishment system such as the AF, the component supply work only needs to be performed before the second emergency time TS2. Accordingly, it is not necessary to wait until the second emergency time TS2 is reached, and the component replenishment work registered in the work list information J53 can be finished early.

Further, the operator OP preferably moves along the first route RT1 within the range of the emergency time zone WET from the first emergency time TS1 to the second emergency time TS2, and performs the component replenishment work for each replenishment target device registered between the top and the bottom of the work list information J53. In this manner, within the range of the emergency time zone WET which is a timing of performing the component replenishment work for the first and second emergency devices, "collective replenishment" becomes possible, in which the operator OP performs the component replenishment work collectively for a replenishment target device which is a target of the component replenishment work.

The mobile terminal device 7 carried by the operator OP may be configured to guide a work area in which a component supply device, for which next component replenishment work is to be performed, is disposed, or to guide the component supply device itself to the operator OP every time each component replenishment work is finished based on the work plan information JH5.

Note that, in the above example, the emergency device extraction unit 342 is configured to extract the first emergency device having the highest degree of emergency and the second emergency device having the second highest degree of emergency, and the emergency time setting unit 343 is configured to set the emergency time zone WET from the first emergency time to the second emergency time, the emergency time zone defining a time zone of "collective replenishment" for a replenishment target device. However, the configurations are not limited thereto. The emergency device extraction unit 342 may be configured to extract the second emergency device when input operation for request information requesting operation start of the component replenishment management system 3 is performed for the mobile terminal device 7 after completion of, during, or before the component replenishment work for the first emergency device. In this case, the emergency time setting unit 343 sets, as the emergency time zone WET, a time zone from a predetermined time when the input operation for the request information is performed for the mobile terminal device 7 to the second emergency time corresponding to the second emergency device.

Further, as described above, the emergency device extraction unit 342 extracts the first emergency device and the second emergency device, the replenishment target extraction unit 345 extracts a replenishment target device, and the work plan unit 347 generates the work plan information JH5. After the operator OP performs the component replenishment work based on the work plan information JH5 and the component replenishment work for the second emergency device is finished, the work plan unit 347 generates the next work plan information JH5, and the component replenishment work based on the next work plan information JH5 is performed. Here, it is desirable that the work plan unit 347 automatically generate the next work plan information JH5 by the time immediately after the component replenishment work for the second emergency device is finished. In this case, a component supply device that is the second emergency device in the first work plan information JH5 become a first emergency device registered in the work list information J53 of the next work plan information JH5, and the next second emergency device is newly extracted by the emergency device extraction unit 342. The extraction of the next second emergency device by the emergency device extraction unit 342 is preferably executed by the time the component replenishment work for the second emergency device in the first work plan information JH5 is finished. After that, similarly, the work plan information JH5 is preferably automatically generated.

Further, as described above, even in a case where the emergency device extraction unit 342 first extracts only one emergency device, when the component replenishment work for the emergency device is finished, information representing a plan for the next component replenishment work, which is equivalent to the work plan information JH5, is desirably automatically generated by the work plan unit 347. In this case, the extraction of the next emergency device is executed by the emergency device extraction unit 342 by the time the component replenishment work for the emergency device first extracted by the emergency device extraction unit 342 is finished. In this case as well, information representing a plan for the next component replenishment work, which is equivalent to the work plan information JH5, is preferably automatically generated after that.

Further, the extraction of the replenishment target device for generating the work plan information JH5 is preferably performed between immediately before (after the component replenishment for the second lowest component supply device in the work list information J53 of the work plan information JH5 shown in FIG. 15 is finished) and immediately after the component replenishment work for the second emergency device (that is, the first emergency device in the next work plan information JH5 to be generated) in the previous work plan information JH5. This is because, at this time point, whether or not the component replenishment work is actually performed is determined for each component supply device, and this fact is taken in as data.

Whether or not the component replenishment work is actually finished (for the AF, whether or not both the preceding component storage tape and the subsequent component storage tape are set) is updated in a predetermined cycle (for example, a cycle of 30 seconds) and stored in the memory unit 202 for each component supply device, and the extraction of a replenishment target device described above is executed based on the stored content. Therefore, in a case where there exists a component supply device that is previously registered in the work list information J53 of the work plan information JH5, but the component replenishment work is not performed for the component supply device, the component supply device is an extraction target as the replenishment target device. Further, although it is necessary to notify the replenishment target extraction unit 345 of the end of the component replenishment work, it is conceivable that notification can be made by input operation to the mobile terminal device 7 or the like. In this case, in order to extract a replenishment target device immediately before the component replenishment work for the second emergency device in the first work plan information JH5 to generate the next work plan information JH5, extraction operation is preferably performed at a time point at which the end of the component replenishment work for a component supply device immediately before the second emergency device is notified, and in order to extract a replenishment target device immediately after the component replenishment work for the second emergency device, extraction operation is preferably performed at a time point at which the end of the component replenishment work for the second emergency device is notified. Further, normally, in order to verify whether or not the component to be used for replenishment is of a correct component type when the component replenishment work is performed, reading operation for reading the component type identifying barcode BR or the like attached to the component storage member such as a reel with the barcode reader 8 or the like is performed in a case of the AF. It is possible to consider that the replenishment work for the component storage member is performed by performance of the component verification, and extraction of a replenishment target device may be performed immediately after performance of the component verification at the time of the component replenishment work for a component supply device immediately before the second emergency device, or extraction of a replenishment target device may be performed immediately after performance of the component verification at the time of the component replenishment work for the second emergency device. When the extraction of a replenishment target device is performed, extraction of an emergency device of the next work plan information JH5 may be performed at the same time.

Further, the extraction of the replenishment target device registered in the work list information J53 of the work plan information JH5 is performed for a replenishable device for which the component replenishment work can be performed at a time point of extraction. Therefore, at least until the second emergency time corresponding to the second emergency device, the state where the component replenishment work can be performed continues, and the component replenishment work for these replenishment target devices will not become impossible. On the other hand, there is a case where, although performance of the component replenishment work is not possible at a time point of extraction of the replenishment target device, a component supply device for which performance of the component replenishment work becomes possible before the second emergency time corresponding to the second emergency device is generated. If these are generated and performance of the component replenishment work can be determined to be possible before the second emergency time, the fact that the component replenishment work is possible may be guided to the operator OP. The above-mentioned guidance to the operator OP is preferably performed at a time point of generation. Alternatively, the configuration may be such that only one that is on the downstream side of the current work position on the set movement route, and for which the component replenishment work can be performed within the range of the emergency time zone WET is guided to the operator OP.

<Regarding Modified Example of Control Operation of Replenishment Target Extraction Unit and Movement Route Setting Unit>

(First Modified Example)

Figure 16:
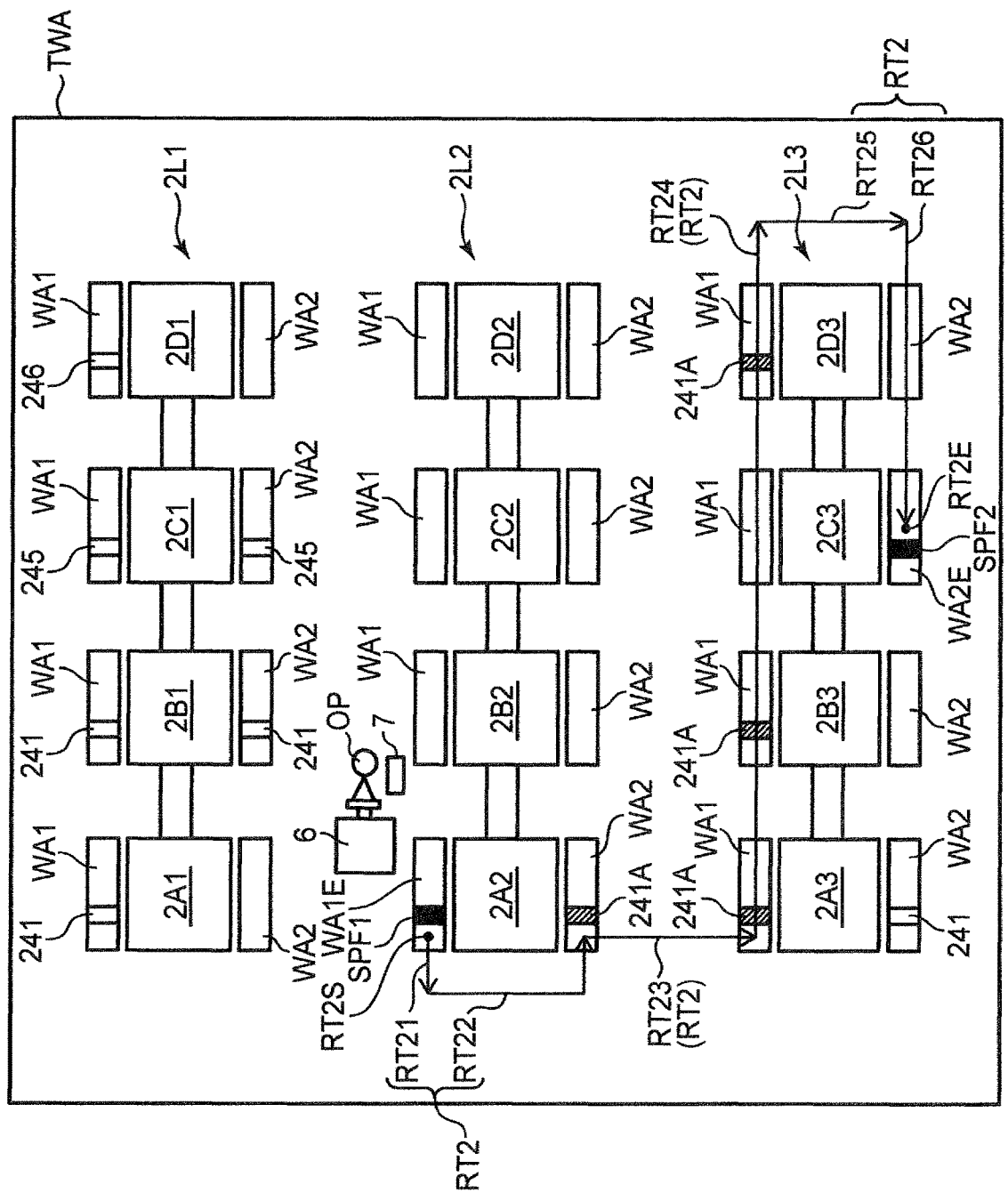
FIG. 16 is a diagram for describing a first modified example of control operation of the replenishment target extraction unit and the movement route setting unit.

FIG. 16 is a diagram for describing a first modified example of control operation of the replenishment target extraction unit 345 and the movement route setting unit 346. Note that, in FIG. 16, the positions of the first and second emergency devices extracted by the emergency device extraction unit 342, and the position of the replenishable device identified by the replenishable device identification unit 344 are similar to those in FIG. 14. Specifically, in the example shown in FIG. 16, the first splicing feeder SPF1 disposed in the first work area WA1 of the first component mounter 2A2 in the second component mounting line 2L2 is extracted as the first emergency device. Further, the second splicing feeder SPF2 disposed in the second work area WA2 of the third component mounter 2C3 in the third component mounting line 2L3 is extracted as the second emergency device.

Furthermore, in the example shown in FIG. 16, in the first component mounting line 2L1, the AF 241A disposed in the first work area WA1 of the first component mounter 2A1, the AF 241 disposed in the first and second work areas WA1 and WA2 of the second component mounter 2B1, the tray feeders 245A and 245 disposed in the first and second work areas WA1 and WA2 of the third component mounter 2C1, and the stick feeder 246A disposed in the first work area WA1 of the fourth component mounter 2D1 are identified as a replenishable device. On the other hand, in the first component mounting line 2L1, the second work area WA2 of the first component mounter 2A1 and the second work area WA2 of the fourth component mounter 2D1 do not have a replenishable device, and are set as a non-work target area which is an area excluded from the target of the component replenishment work.

Further, in the second component mounting line 2L2, the AF 241A disposed in the second work area WA2 of the first component mounter 2A2 is identified as a replenishable device. On the other hand, in the second component mounting line 2L2, the first and second work areas WA1 and WA2 of the second component mounter 2B2, the third component mounter 2C2, and the fourth component mounter 2D2 do not have a replenishable device, and are set as a non-work target area which is an area excluded from the target of the component replenishment work.

Further, in the third component mounting line 2L3, the AFs 241A and 241 disposed in the first and second work areas WA1 and WA2 of the first component mounter 2A3, the AF 241A disposed in the first work area WA1 of the second component mounter 2B3, and the AF 241A disposed in the first work area WA1 of the fourth component mounter 2D3 are identified as a replenishable device. On the other hand, in the third component mounting line 2L3, the second work area WA2 of the second component mounter 2B3, the first work area WA1 of the third component mounter 2C3, and the second work area WA2 of the fourth component mounter 2D3 do not have a replenishable device, and are set as a non-work target area which is an area excluded from the target of the component replenishment work.

The first modified example is an example of a case where the replenishment target extraction unit 345 narrows down the range in which the replenishment target device is extracted from a plurality of replenishable devices, and a replenishable device outside the narrowed range is not extracted as the replenishment target device. With respect to the point that the movement route setting unit 346 sets the movement route after the replenishment target extraction unit 345 extracts the replenishment target device within the narrowed range, the first modified example is similar to the example shown in FIG. 14 described above.

In the first modified example, in a case where a non-emergency target line exists, the movement route setting unit 346 may be configured to set a second route RT2 that does not pass through the non-emergency target line as the movement route of the operator OP. In the work area TWA, a range on the second route RT2 that does not pass through the non-emergency target line and narrowed down by exclusion of the non-emergency target line is a range in which the replenishment target extraction unit 345 extracts a replenishment target device. In other words, the non-emergency target line is outside the range in which the replenishment target extraction unit 345 extracts a replenishment target device. In the plurality of component mounting lines 2L1, 2L2, and 2L3 in the work area TWA, a line other than a component mounting line including the first emergency work area WA1E in which the first emergency device is disposed or the second emergency work area WA2E in which the second emergency device is disposed is set as the non-emergency target line. Further, in a case where another component mounting line is disposed between a component mounting line including the first emergency work area WA1E and a component mounting line including the second emergency work area WA2E, the another component mounting line, which is basically treated as the non-emergency target line, may be set as an extraction range for a replenishment target device by the replenishment target extraction unit 345 without being set as the non-emergency target line. In a case where the another component mounting line is excluded from the non-emergency target line, the non-emergency target line can be considered as a component mounting line that is disposed on the side away from the component mounting line including the first emergency work area WA1E to the component mounting line including the second emergency work area WA2E. In the example shown in FIG. 16, the non-emergency target line is the first component mounting line 2L1 not including the first emergency work area WA1E where the first splicing feeder SPF1 as the first emergency device is disposed and the second emergency work area WA2E where the second splicing feeder SPF2 as the second emergency device is disposed.

The second route RT2 set by the movement route setting unit 346 is a movement route that is continuous in a single stroke that does not pass through or intersect the first component mounting line 2L1 as a non-emergency target line, the second route RT2 having the first emergency work area WA1E as a start point RT2S and the second emergency work area WA2E as an end point RT2E. Further, in a case where a non-work target area in which the replenishable device is not disposed exists, it is desirable that the movement route setting unit 346 set, as the second route RT2, a route that does not pass through the non-work target area within a range where the route can be provided in a single stroke without an intersection. In this manner, a route length of the movement route of the operator OP can be shortened.

Furthermore, in the first modified example, the movement route setting unit 346 sets, as the second route RT2 which is the movement route of the operator OP, a route that does not pass through a non-work target area, in which the replenishable device is not disposed, as much as possible and has a largest number of replenishable devices. In this manner, after a route length of the movement route of the operator OP is shortened, the component replenishment work can be performed by the operator OP for replenishment target devices, disposed in the work areas WA1 and WA2 on the second route RT2, as many as possible.

In the example shown in FIG. 16, the second route RT2 set by the movement route setting unit 346 is a route that is continuous in a single stroke without an intersection, the route including a first straight route portion RT21, a first connecting route portion RT22, a second connecting route portion RT23, a second straight route portion RT24, a third connecting route portion RT25, and a third straight route portion RT26.

The first straight route portion RT21 is a straight route portion extending from the first work area WA1E (first emergency work area) of the first component mounter 2A2 in the second component mounting line 2L2 where the first splicing feeder SPF1 as the first emergency device is disposed toward an end portion on the −X side of the second component mounting line 2L2. In the second component mounting line 2L2, each of the first work areas WA1 of the second to fourth component mounters 2B2, 2C2, and 2D2 disposed on the +X side with respect to the first component mounter 2A2 is a non-work target area where a replenishable device is not disposed. For this reason, the movement route setting unit 346 sets the first straight route portion RT21 extending from the first work area WA1E as the first emergency work area toward the end portion on the −X side to obtain a route that does not pass through each of the first work areas WA1 of the second to fourth component mounters 2B2, 2C2, and 2D2, which are non-work target areas in the second component mounting line 2L2.

The first connecting route portion RT22 is a route portion that extends from the +Y side toward the −Y side from an end portion on the −X side of the first straight route portion RT21 to the second work area WA2 of the first component mounter 2A2 on an outer side than a side edge on the −X side of the second component mounting line 2L2. The first connecting route portion RT22 extends to the second work area WA2 of the first component mounter 2A2 in which the AF 241A as a replenishable device in the second component mounting line 2L2 is disposed. In the second component mounting line 2L2, each of the second work areas WA2 of the second to fourth component mounters 2B2, 2C2, and 2D2 disposed on the +X side with respect to the first component mounter 2A2 is a non-work target area where a replenishable device is not disposed. For this reason, the movement route setting unit 346 sets the first connecting route portion RT22 extending to the second work area WA2 of the first component mounter 2A2 in which the AF 241A as a replenishable device is disposed to obtain a route that does not pass through each of the second work areas WA2 of the second to fourth component mounters 2B2, 2C2, and 2D2, which are non-work target areas in the second component mounting line 2L2.

The second connecting route portion RT23 connects an end portion on the −Y side of the first connecting route portion RT22 and an end portion on the −X side of the second straight route portion RT24, and extends from the +Y side toward the −Y side. The second connecting route portion RT23 extends from the second work area WA2 of the first component mounter 2A2 in the second component mounting line 2L2 to the first work area WA1 of the first component mounter 2A3 in the third component mounting line 2L3.

The second straight route portion RT24 is a straight route portion that passes through all of the first work areas WA1 of the first to fourth component mounters 2A3, 2B3, 2C3, and 2D3 in the third component mounting line 2L3, and extends from an end portion on the −X side toward an end portion on the +X side along the third component mounting line 2L3. The second straight route portion RT24 passes through each of the first work areas WA1 of the first component mounter 2A3, the second component mounter 2B3, and the fourth component mounter 2D3 where the AF 241A as a replenishable device in the third component mounting line 2L3 is disposed. In the third component mounting line 2L3, the first work area WA1 of the third component mounter 2C3 is a non-work target area where a replenishable device is not disposed. However, it is impossible to set a route in a single stroke that passes through the first work area WA1 of the first component mounter 2A3, the second component mounter 2B3, and the fourth component mounter 2D3 in which the AF 241A as a replenishable device is disposed and does not pass through the first work area WA1 of the third component mounter 2C3 which is a non-work target area. For this reason, the movement route setting unit 346 sets the second straight route portion RT24 that passes through a non-work target area and passes through the first work area WA1 of the first component mounter 2A3, the second component mounter 2B3, and the fourth component mounter 2D3 in which the AF 241A as a replenishable device is disposed.

The third connecting route portion RT25 is a route portion that connects an end portion on the +X side of the second straight route portion RT24 and an end portion on the +X side of the third straight route portion RT26 on an outer side than a side edge on the +X side of the third component mounting line 2L3, and extends from the +Y side toward the −Y side.

The third straight route portion RT26 is a straight route portion extending from an end portion on the +X side of the third component mounting line 2L3 to the second work area WA2E (second emergency work area) of the third component mounter 2C3 where the second splicing feeder SPF2 as the second emergency device is disposed. In the third component mounting line 2L3, the second work area WA2 of the fourth component mounter 2D3 is a non-work target area where a replenishable device is not disposed. However, it is impossible to set a route in a single stroke that extends to the second work area WA2E of the third component mounter 2C3 where the second emergency device is disposed without passing through the second work area WA2 of the fourth component mounter 2D3 as a non-work target area. For this reason, the movement route setting unit 346 sets the third straight route portion RT26 that passes through the second work area WA2 of the fourth component mounter 2D3 which is the non-work target area and extends to the second work area WA2E of the third component mounter 2C3 where the second emergency device is disposed.

Next, in the first modified example, the replenishment target extraction unit 345 extracts, from among a plurality of replenishable devices identified by the replenishable device identification unit 344, a replenishable device that is disposed in the work areas WA1 and WA2 on the second route RT2 as a target of the component replenishment work within the range of the emergency time zone WET. The second route RT2 is a movement route that does not pass through the first component mounting line 2L1 as a non-emergency target line. For this reason, the replenishment target extraction unit 345 extracts a replenishment target device from a range on the second route RT2 that is a range narrowed down by excluding the first component mounting line 2L1 in the work area TWA, and does not extract a replenishment target device from the first component mounting line 2L1. In the example shown in FIG. 16, the replenishment target extraction unit 345 extracts, as a replenishment target device, the AF 241A disposed in the second work area WA2 of the first component mounter 2A2 in the second component mounting line 2L2, and each of the first work areas WA1 of the first component mounter 2A3, the second component mounter 2B3, and the fourth component mounter 2D3 in the third component mounting line 2L3 positioned on the second route RT2.

As described above, in the first modified example, the movement route setting unit 346 sets, as the movement route of the operator OP, the second route RT2 in a single stroke that does not pass through the first component mounting line 2L1 as a non-emergency target line not including the component mounter 2 to which the first and second emergency work areas WA1E and WA2E are set. In this manner, it is possible to shorten a route length of the movement route of the operator OP, and the operator OP can perform the component replenishment work for the first and second emergency devices with high degree of emergency more reliably with enough time. Furthermore, the replenishment target extraction unit 345 extracts a replenishable device disposed in the work areas WA1 and WA2 on the second route RT2 as a replenishment target device. In this manner, the operator OP can move along the second route RT2 having a simple shape of a single stroke and perform the component replenishment work for a replenishment target device disposed in the work areas WA1 and WA2 on the second route RT2.

Note that, in the above example, in order to narrow down the extraction range of a replenishment target device by the replenishment target extraction unit 345, a non-emergency target line is excluded from the extraction range, and the component mounting line is used as a unit for narrowing down the extraction range. However, the configuration is not limited thereto. For example, lanes representing the arrangement along the X-axis direction of the first and second work areas WA1 and WA2 set on the +Y side and the −Y side of each of the component mounters 2 in the component mounting line may be used as a unit for narrowing down the extraction range. In this case, a lane other than a lane including the first emergency work area WA1E in which the first emergency device is disposed or a lane including the second emergency work area WA2E in which the second emergency device is disposed, is excluded from the extraction range. Alternatively, a lane other than lanes including the first and second emergency work areas WA1E and WA2E and a lane therebetween may be set as a lane excluded from the extraction range.

(Second Modified Example)

Figure 17:
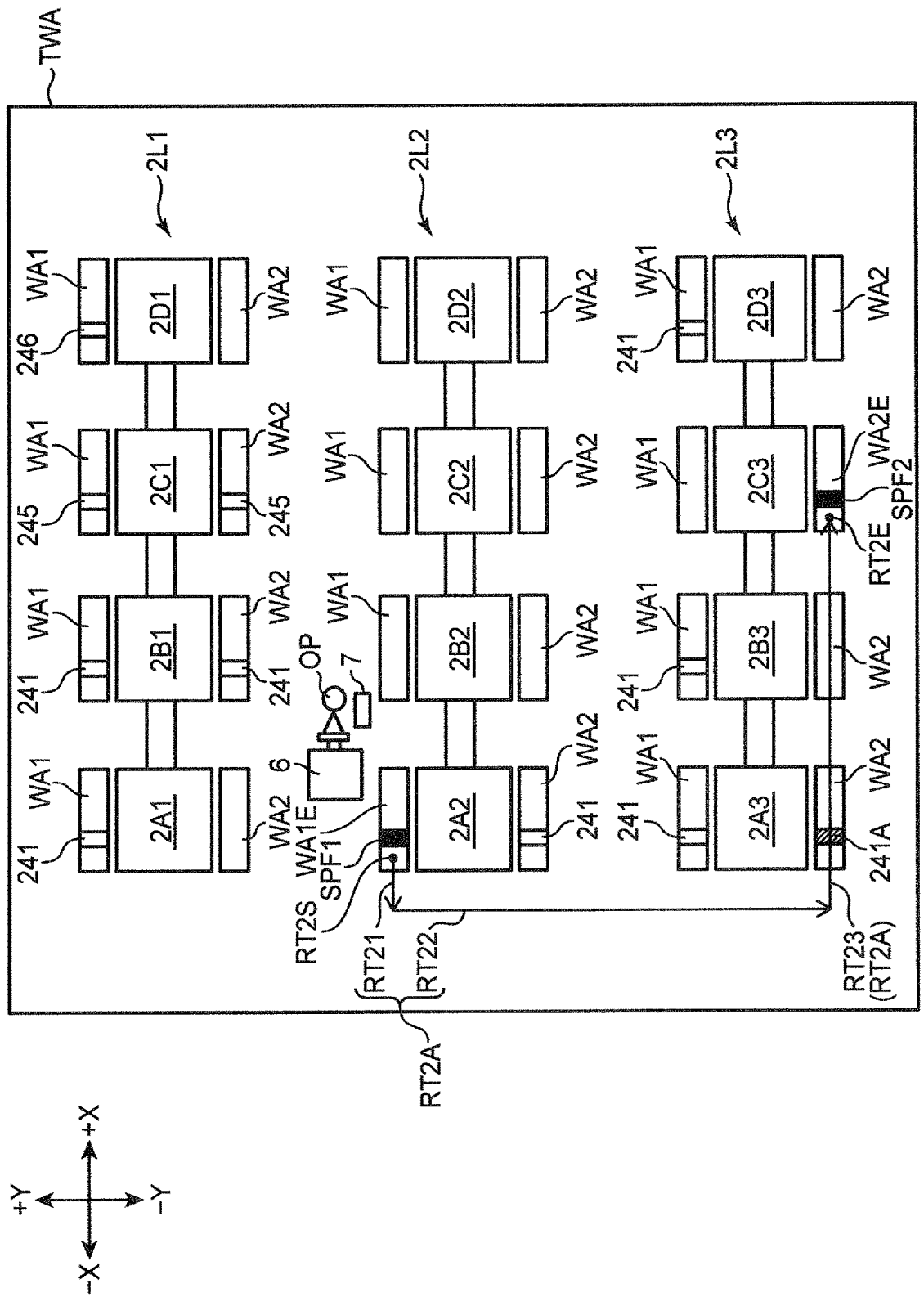
FIG. 17 is a diagram for describing a second modified example of control operation of the replenishment target extraction unit and the movement route setting unit.

FIG. 17 is a diagram for describing a second modified example of control operation of the replenishment target extraction unit 345 and the movement route setting unit 346. Note that, in FIG. 17, the positions of the first and second emergency devices extracted by the emergency device extraction unit 342, and the position of the replenishable device identified by the replenishable device identification unit 344 are similar to those in FIGS. 14 and 16.

The second modified example is an example of a case where the replenishment target extraction unit 345 narrows down the range in which the replenishment target device is extracted from a plurality of replenishable devices, and an example of a case where a replenishment target device is extracted after the movement route setting unit 346 sets the movement route.

In the second modified example, similarly to the first modified example, the movement route setting unit 346 sets a second route RT2A that does not pass through a non-emergency target line as the movement route of the operator OP. In the example shown in FIG. 17, the non-emergency target line is the first component mounting line 2L1 not including the first emergency work area WA1E where the first splicing feeder SPF1 as the first emergency device is disposed and the second emergency work area WA2E where the second splicing feeder SPF2 as the second emergency device is disposed.

The second route RT2A set by the movement route setting unit 346 is a movement route that is continuous in a single stroke that does not pass through or intersect the first component mounting line 2L1 as a non-emergency target line, the second route RT2A having the first emergency work area WA1E as a start point RT2S and the second emergency work area WA2E as an end point RT2E. Further, in a case where a non-work target area in which the replenishable device is not disposed exists, it is desirable that the movement route setting unit 346 set, as the second route RT2A, a route that does not pass through the non-work target area within a range where the route can be provided in a single stroke without an intersection. In this manner, a route length of the movement route of the operator OP can be shortened.

Furthermore, in the second modified example, the movement route setting unit 346 sets a route having a shortest route length as the second route RT2A. In this manner, the operator OP can perform the component replenishment work for the first and second emergency devices with high degree of emergency more reliably with enough time.

The movement route setting unit 346 sets the second route RT2A having a shortest route length by comparing and calculating route lengths of all assumed routes in a single stroke from the first emergency work area WA1E to the second emergency work area WA2E. The movement route setting unit 346 excludes, from a candidate for a shortest movement route, a route that passes through lanes other than a lane including the first and second emergency work areas WA1E and WA2E among lanes in which the first and second work areas WA1 and WA2 set on the +Y side and the −Y side of each of the component mounters 2 on the component mounting line are arranged in the X-axis direction. Further, for a straight route portion extending from the first emergency work area WA1E in the X-axis direction along a lane including the first emergency work area WA1E and a straight route portion extending to the second emergency work area WA2E in the X-axis direction along a lane including the second emergency work area WA2E, the movement route setting unit 346 sets a movement route so that a length combining the straight route portions becomes short. Then, the movement route setting unit 346 sets the second route RT2A having a shortest route length by combining a straight route portion extending in the X-axis direction from the first emergency work area WA1E, a straight route portion extending in the X-axis direction to the second emergency work area WA2E, and a connecting route portion extending in the Y-axis direction connecting these straight route portions.

In the example shown in FIG. 17, the first emergency work area WA1E in which the first splicing feeder SPF1 as the first emergency device is disposed is the first work area on the +Y side of the first component mounter 2A2 positioned furthest on the −X side in the second component mounting line 2L2. Further, the second emergency work area WA2E in which the second splicing feeder SPF2 as the second emergency device is disposed is the second work area on the −Y side of the third component mounter 2C3 positioned second furthest on the +X side in the third component mounting line 2L3. The shortest second route RT2A set by the movement route setting unit 346 does not pass through a lane in which the second work areas WA2 on the −Y side of the component mounters 2A2, 2B2, 2C2, and 2D2 in the second component mounting line 2L2 are arranged in the X-axis direction, and a lane in which the first work areas WA1 on the +Y side of the component mounters 2A3, 2B3, 2C3, and 2D3 in the third component mounting line 2L3 are arranged in the X-axis direction. Then, the second route RT2A is a route that is continuous in a single stroke without an intersection, the route including the first straight route portion RT21, the first connecting route portion RT22, and the second straight route portion RT23.

The first straight route portion RT21 is a straight route portion extending from the first work area WA1E (first emergency work area) of the first component mounter 2A2 in the second component mounting line 2L2 where the first splicing feeder SPF1 as the first emergency device is disposed toward an end portion on the −X side of the second component mounting line 2L2. In the second component mounting line 2L2, each of the first work areas WA1 of the second to fourth component mounters 2B2, 2C2, and 2D2 disposed on the +X side with respect to the first component mounter 2A2 is a non-work target area where a replenishable device is not disposed. For this reason, the movement route setting unit 346 sets the first straight route portion RT21 extending from the first work area WA1E as the first emergency work area toward the end portion on the −X side to obtain a route that does not pass through each of the first work areas WA1 of the second to fourth component mounters 2B2, 2C2, and 2D2, which are non-work target areas in the second component mounting line 2L2.

The first connecting route portion RT22 is a route portion that connects an end portion on the −X side of the first straight route portion RT21 and an end portion on the −X side of the second straight route portion RT23 on an outer side than a side edge on the −X side of the second and third component mounting lines 2L2 and 2L3, and extends from the +Y side toward the −Y side.

The second straight route portion RT23 is a straight route portion extending from an end portion on the −X side of the third component mounting line 2L3 to the second work area WA2E (second emergency work area) of the third component mounter 2C3 where the second splicing feeder SPF2 as the second emergency device is disposed. The second straight route portion RT23 passes through the second work area WA2 of the first component mounter 2A3 in which the AF 241A as a replenishable device is disposed in the third component mounting line 2L3. In the third component mounting line 2L3, the second work area WA2 of the second component mounter 2B3 is a non-work target area where a replenishable device is not disposed. However, it is impossible to set a route in a single stroke that extends to the second work area WA2E of the third component mounter 2C3 where the second emergency device is disposed without passing through the second work area WA2 of the second component mounter 2B3 as a non-work target area. For this reason, the movement route setting unit 346 sets the second straight route portion RT23 that passes through the second work area WA2 of the first component mounter 2A3 where the AF 241A as a replenishable device is disposed and the second work area WA2 of the second component mounter 2B3 that is a non-work target area, and extends to the second work area WA2E of the third component mounter 2C3 where the second emergency device is disposed.

As a candidate of the shortest movement route, a route including a straight route portion extending from the first emergency work area WA1E of the second component mounting line 2L2 toward the +X side and a straight route portion extending toward the −X side from an end portion on the +X side of the third component mounting line 2L3 to the emergency work area WA2E can be considered. However, in this candidate route, a length obtained by combining the straight route portions is equivalent to an X-axis direction width of four of the component mounters, and is longer than a length obtained by combining the first straight route portion RT21 and the second straight route portion RT23 (equivalent to an X-axis direction width of three of the component mounters). For this reason, the movement route setting unit 346 sets, as the shortest movement route, the second route RT2A that is a combination of the first straight route portion RT21, the second straight route portion RT23, and the first connecting route portion RT22 connecting these straight route portions.

Next, in the second modified example, the replenishment target extraction unit 345 extracts, from among a plurality of replenishable devices identified by the replenishable device identification unit 344, a replenishable device that is disposed in the work areas WA1 and WA2 on the second route RT2A as a target of the component replenishment work within the range of the emergency time zone WET. In the example shown in FIG. 17, the replenishment target extraction unit 345 extracts, as a replenishment target device, the AF 241A disposed in the second work area WA2 of the first component mounter 2A3 in the third component mounting line 2L3 positioned on the second route RT2A.

Note that, whether the set range of the movement route is the entire range of the work area TWA like the first route RT1 shown in FIG. 14, or the narrowed range like the second route RT2 of the first modified example shown in FIG. 16 may be set and determined in advance, or whether the set range is the entire range or the narrowed range may be selected according to an extraction state of the replenishment target device. Further, even if the movement route is set in advance like the first route RT1 or the second route RT2, in a case where it is not possible to extract a replenishment target device for which the component replenishment work can be performed within the range of the emergency time zone WET by the extraction operation of the replenishment target extraction unit 345, a movement route having a shortest route length may be set as the second route RT2A of the second modified example shown in FIG. 17.

As described above, in the second modified example, the movement route setting unit 346 sets the second route RT2A having a shortest route length, and the replenishment target extraction unit 345 extracts, as a replenishment target device for which the component replenishment work is to be performed within the range of the emergency time zone WET, a replenishable device disposed in the work areas WA1 and WA2 on the second route RT2A. In this manner, the operator OP can perform the component replenishment work for the first and second emergency devices having a high degree of emergency more reliably with enough time, and can perform "collective replenishment" in which the component replenishment work is performed collectively for replenishment target devices within the range of the emergency time zone WET. Note that the replenishment target extraction unit 345 does not extract a replenishment target device in a case where a replenishable device does not exist on the shortest second route RT2A set by the movement route setting unit 346, or in a case where the component replenishment work cannot be completed within the range of the emergency time zone WET although a replenishable device exists.

Although the component replenishment management system and the component mounting system according to the embodiment of the present disclosure has been described above, the present disclosure is not limited thereto, and, for example, a modification as described below can be employed.

The operator OP sequentially performs the component replenishment work represented by the work list information J53 by moving along a movement route represented by the movement route information J54 based on the work plan information JH5 displayed on the mobile terminal device 7 or the like. The operator OP performs the component replenishment work for the first emergency device registered at the top of the work list information J53 at the first emergency time TS1 represented by the first emergency time information J51, and performs the component replenishment work for the second emergency device registered at the bottom of the work list information J53 at the second emergency time TS2 represented by the second emergency time information J52. Further, the operator OP moves along a movement route within the range of the emergency time zone WET from the first emergency time TS1 to the second emergency time TS2, and performs the component replenishment work for each replenishment target device registered between the top and the bottom of the work list information J53. In a case where the work is time-consuming in the process of performing the component replenishment work for the replenishment target device within the range of the emergency time zone WET, there is a possibility that the second emergency time TS2, which is the latest time of the emergency time zone WET, is reached before the component replenishment work for all the replenishment target devices extracted by the replenishment target extraction unit 345 is not finished. In such a case, it becomes too late for the component replenishment work for the second emergency device at the second emergency time TS2.

In view of the above, the replenishment target extraction unit 345 is configured to monitor in real time a progress state of the component replenishment work performed for each component replenishment target device, and determine that the progress state is in a state of either work end or work not performed. The work progress state information representing a determination result of the progress state of the component replenishment work by the replenishment target extraction unit 345 is added to the work list information J53 of the work plan information JH5 shown in FIG. 15.

Furthermore, the replenishment target extraction unit 345 executes change extraction operation for changing a replenishment target device according to a progress state of the component replenishment work. The change extraction operation by the replenishment target extraction unit 345 is executed every time the component replenishment work for one of the component replenishment target devices is finished, that is, every time the progress state of the component replenishment work for one of the replenishment target devices is determined to make a transition from "work not performed" to "work end". Alternatively, the change extraction operation by the replenishment target extraction unit 345 is executed every time the component replenishment work for each replenishment target device disposed in one work area is finished.

Further, the movement route setting unit 346 may be configured to change the movement route according to the change of the replenishment target device when the change extraction operation is executed by the replenishment target extraction unit 345. Further, when the change extraction operation is executed by the replenishment target extraction unit 345, the work plan unit 347 updates the work list information J53 of the work plan information JH5 shown in FIG. 15 according to the change of the replenishment target device. The work plan information JH5 in which the work list information J53 is updated is displayed on the mobile terminal device 7 or the like carried by the operator OP. The mobile terminal device 7 guides a work area in which a component supply device, for which the next component replenishment work is to be performed, is disposed, or the component supply device itself to the operator OP every time one component replenishment work is finished based on the work plan information JH5 in which the work list information J53 is updated.

The change extraction operation of the replenishment target extraction unit 345 will be described in more detail. The replenishment target extraction unit 345 measures remaining time until the work time in the work area TWA of the operator OP reaches the second emergency time TS2 which is the latest time of the emergency time zone WET. Then, the replenishment target extraction unit 345 extracts a replenishment target device for which the component replenishment work can be performed within the remaining time among replenishment target devices for which the progress state of the component replenishment work represented by the work progress state information added to the work list information J53 of the work plan information JH5 is "work not performed". The replenishment target extraction unit 345 extracts replenishment target devices for which the component replenishment work can be performed within the remaining time in descending order of priority of performing the component replenishment work based on the component replenishment time limit WT represented by the component replenishment time limit information J44 included in the component supply monitoring information JH4 (FIG. 13) generated by the component supply monitoring unit 341. The replenishment target extraction unit 345 determines that one having the short component replenishment time limit WT has a high priority of performing the component replenishment work. The replenishment target extraction unit 345 extracts replenishment target devices within a range in which the total work standard time WS represented by the work standard time information J45 included in the component supply monitoring information JH4 does not exceed the remaining time.

The replenishment target extraction unit 345 sets a "skip" state to the progress state of the component replenishment work for a replenishment target device excluded from an extraction target by the change extraction operation among replenishment target devices for which the progress state of the component replenishment work represented by the work progress state information added to the work list information J53 of the work plan information JH5 is "work not performed". As for the component replenishment work whose work progress state information is set to the "skip" state by the replenishment target extraction unit 345, its performance is postponed.

As described above, the work plan information JH5 in which the work list information J53 is updated according to the change of a replenishment target device by the change extraction operation of the replenishment target extraction unit 345 is displayed on the mobile terminal device 7 or the like carried by the operator OP. Based on the updated work list information J53, the component replenishment work by the operator OP proceeds. In the process in which the change extraction operation by the replenishment target extraction unit 345 is repeated, the component replenishment target device that is set to the "skip" state on a downstream side in the movement route of the current work position may be extracted as a replenishment target device for which the component replenishment work can be performed within the remaining time due to a reason that the component replenishment work progresses quickly or the like.

Note that the specific embodiments described above mainly include embodiments having a configuration below.

A component replenishment management system according to an aspect of the present disclosure is a system for managing, in a component mounting line in which a plurality of component mounters for mounting a component on a substrate to produce a component mounting substrate are connected, component replenishment work for replenishing a plurality of component supply devices provided side by side in a work area set to each of the plurality of component mounters with a component storage member. The component replenishment management system includes an emergency device extraction unit configured to extract, as an emergency device, a component supply device for which the component replenishment work is to be performed urgently based on a component replenishment time limit that is set for each of a plurality of the component supply devices in each of the work areas, the component replenishment time limit being time until the component replenishment work is required to be performed, an emergency time setting unit configured to set an emergency time zone from a predetermined time to an emergency time at which the component replenishment work is to be performed for the emergency device, a replenishable device identification unit configured to identify, as a replenishable device, a plurality of component supply devices that is allowed to be replenished with the component storage member based on a supply state of a component in each of a plurality of the component supply devices, and a replenishment target extraction unit configured to extract a replenishment target device that is a target of the component replenishment work within a range of the emergency time zone among the plurality of replenishable devices.

Further, in the above component replenishment management system, the emergency device extraction unit is configured to extract, as a first emergency device and a second emergency device, top two component supply devices having highest degree of emergency for performing the component replenishment work based on the component replenishment time limit, and the emergency time setting unit is configured to set, as the emergency time zone, a time zone from a first emergency time at which the component replenishment work is to be performed for the first emergency device to a second emergency time at which the component replenishment work is to be performed for the second emergency device.

According to this component replenishment management system, among the component supply devices provided side by side in the work areas set in the component mounters of the component mounting line, the first and second emergency devices having high degree of emergency for performing the component replenishment work are extracted by the emergency device extraction unit. The operator can perform the component replenishment work for the first emergency device using the first emergency time as a guide, and the component replenishment work for the second emergency device using the second emergency time as a guide. Furthermore, in the component replenishment management system, the replenishment target extraction unit extracts a replenishment target device that is a target of the component replenishment work within the range of the emergency time zone from the first emergency time to the second emergency time. In this manner, within the range of the emergency time zone which is a timing of performing the component replenishment work for the first and second emergency devices, "collective replenishment" becomes possible, in which the operator performs the component replenishment work collectively for a replenishment target device which is a target of the component replenishment work. For this reason, the frequency of the operator going to the component mounter in which the component supply devices are provided in parallel can be lowered to reduce the load of the component replenishment work by the operator, and the efficiency of the component replenishment work can be improved.

The component replenishment management system may be configured to further include a movement route setting unit configured to set a movement route of an operator who performs the component replenishment work, the movement route having a start point at a first emergency work area, which is the work area in which the first emergency device is disposed, and an end point at a second emergency work area, which is the work area in which the second emergency device is disposed.

In this aspect, the operator can perform the component replenishment work for the first emergency device in the first emergency work area, which is the start point of the movement route set by the movement route setting unit, and can perform the component replenishment work for the second emergency device in the second emergency work area, which is the end point of the movement route. Then, while moving on the movement route from the start point to the end point, the operator can perform the component replenishment work for the replenishment target device for which the component replenishment work is to be performed within the range of the emergency time zone. By moving along the movement route, the operator can efficiently perform the component replenishment work for the first and second emergency devices and the replenishment target device while reducing unnecessary movement.

In the above component replenishment management system, the replenishment target extraction unit is configured to extract the replenishment target devices for which the component replenishment work is allowed to be performed within a range of the emergency time zone as many as possible based on work standard time required from start to end of the component replenishment work. The movement route setting unit may be configured to set, as the movement route, a route that passes through all of the work areas where the replenishment target device extracted by the replenishment target extraction unit is disposed between the start point and the end point.

In this aspect, the operator can perform the component replenishment work for the first and second emergency devices at each of the start point and the end point of the movement route. Then, while moving on the movement route from the start point to the end point, the operator can perform the component replenishment work for all the replenishment target devices for which the component replenishment work can be performed within the range of the emergency time zone.

In the above component replenishment management system, the replenishment target extraction unit may be configured to extract the replenishment target devices in descending order of priority of performing the component replenishment work based on the component replenishment time limit.

In this aspect, the replenishment target devices as the target of the component replenishment work within the emergency time zone are extracted in descending order of priority of performing the component replenishment work. In this manner, the operator can perform the component replenishment work with high priority based on the component replenishment time limit within the range of the emergency time zone.

In the above component replenishment management system, a plurality of the component mounting lines are provided side by side. In a case where a non-emergency target line exists, the non-emergency target line being the component mounting line that does not include the component mounter in which the first emergency work area and the second emergency work area are set, the movement route setting unit is configured to set, as the movement route, a route that is continuous in a single stroke without an intersection, the route not passing through the non-emergency target line and including a straight route portion extending along the component mounting line between the start point and the end point. The replenishment target extraction unit may be configured to extract, as the replenishment target device, a replenishable device disposed in the work area on the movement route among the plurality of replenishable devices.

In this aspect, the movement route setting unit sets, as the movement route of the operator, a route in a single stroke that does not pass through the non-emergency target line not including the component mounter in which the first and second emergency work areas are set. In this manner, it is possible to shorten a route length of the movement route of the operator, and the operator can perform the component replenishment work for the first and second emergency devices with high degree of emergency more reliably with enough time. Furthermore, the operator can move along the movement route having a simple shape of a single stroke and perform the component replenishment work for a replenishment target device disposed in the work area on the second route.

In the above component replenishment management system, in a case where a non-work target area exists, the non-work target area being an area in which the replenishable device is not disposed in each of the work areas and which is excluded from a target of the component replenishment work, the movement route setting unit may be configured to set, as the movement route, a route that does not pass through the non-work target area within a range in which the route is allowed to be provided in a single stroke without an intersection.

In this aspect, the movement route setting unit sets, as the movement route of the operator, a route which does not pass through the non-work target area, in which the replenishable device is not disposed, as much as possible. In this manner, a route length of the movement route of the operator can be shortened.

In the above component replenishment management system, the movement route setting unit may be configured to set, as the movement route, a route having a largest number of the replenishable devices within a range in which the route is allowed to be provided in a single stroke without an intersection.

In this aspect, the movement route setting unit sets, as the movement route of the operator, a route that does not pass through a non-work target area, in which the replenishable device is not disposed, as much as possible and has a largest number of replenishable devices. In this manner, after a route length of the movement route of the operator is shortened, the component replenishment work can be performed by the operator for replenishment target devices, disposed in the work area on the movement route, as many as possible.

In the above component replenishment management system, the movement route setting unit may be configured to set, as the movement route, a route having a shortest route length.

In this aspect, a route having the shortest route length is set as the movement route. In this manner, the operator can perform the component replenishment work for the first and second emergency devices with high degree of emergency more reliably with enough time.

In the above component replenishment management system, the component supply device includes a component supply device in a first replenishment system and a component supply device in a second replenishment system which have different systems of replenishment with the component storage member. The component supply device in the first replenishment system is a device capable of mounting a plurality of the component storage members and for which the component replenishment work is allowed to be performed with a component storage member for replenishment in a state where a preceding component storage member for which component supply is performed first runs out of a component and component supply from a subsequent component storage member is allowed to be performed. The component supply device in the second replenishment system is a device for which splicing work for joining a front end portion of a component storage tape for replenishment to a rear end portion of a component storage tape as the component storage member needs to be performed as the component replenishment work immediately before the component storage tape runs out of a component. Then, the emergency device is the component supply device in the second replenishment system.

In the component supply device in the second replenishment system, the splicing work needs to be performed as the component replenishment work immediately before the component storage tape runs out of the component, that is, immediately before the component replenishment time limit is reached. For this reason, a performing timing of the component replenishment work for the component supply device in the second replenishment system is restricted to immediately before the preceding component storage tape runs out of the component, and the degree of freedom in time is low. When the component replenishment work for the component supply device in the second replenishment system becomes possible, it is immediately before the component replenishment time limit is reached. That is, the component supply device in the second replenishment system is always immediately before the component replenishment time limit is reached at a timing at which the component replenishment work becomes possible, and is likely to become the emergency device having high degree of emergency for performing the component replenishment work.

On the other hand, for the component supply device in the first replenishment system that can mount a plurality of the component storage members, the component replenishment work for replenishing with the component storage member for replenishment can be performed in a state where the component can be supplied from the subsequent component storage member even if the preceding component storage member runs out of the component. For this reason, the timing of performing the component replenishment work for the component supply device in the first replenishment system is not restricted to a time point at which the preceding component storage member runs out of the component, and there is higher degree of freedom in time as compared to the second replenishment system. When the component replenishment work for the component supply device in the first replenishment system becomes possible, the component can be supplied from the subsequent component storage member, and there is enough time until the component replenishment time limit is reached. For this reason, the component supply device in the first replenishment system can be handled appropriately as a replenishment target device that is a target of the component replenishment work within the range of the emergency time zone that defines a time of the component replenishment work for the emergency device.

A component mounting system according to another aspect of the present disclosure includes a component mounting line in which a plurality of component mounters for mounting a component on a substrate to produce a component mounting substrate are connected, and the component replenishment management system that manages component replenishment work for replenishing a plurality of component supply devices provided side by side in a work area set to each of the plurality of component mounters with a component storage member.

According to this component mounting system, the component replenishment management system capable of improving the efficiency of the component replenishment work for the component supply device is included. Accordingly, stoppage of the supply of the component from the component supply device due to delay in the component replenishment work by the operator during the production of the component mounting substrate is suppressed as much as possible. In this manner, lowering in the production efficiency of the component mounting substrate can be suppressed.

As described above, according to the present disclosure, the component replenishment management system capable of improving the efficiency of the component replenishment work for a component supply device attached to each component mounter in the component mounting line, and the component mounting system including the component replenishment management system can be provided.

What is claimed is:

1. A component replenishment management system including a processor that performs processing to manage, in a component mounting line in which a plurality of component mounters for mounting a component on a substrate to produce a component mounting substrate are connected, component replenishment work for replenishing a plurality of component supply devices provided side by side in a work area set to each of the plurality of component mounters with a component storage member, the processor configured to:
   extract, as a first emergency device and a second emergency device, a top two component supply devices having a highest degree of emergency for performing the component replenishment work based on a component replenishment time limit that is set for each of the plurality of component supply devices in each of the work areas, the component replenishment time limit being time until the component replenishment work is required to be performed;
   set, as an emergency time zone, a time zone from a first emergency time at which the component replenishment work is to be performed for the first emergency device to a second emergency time at which the component replenishment work is to be performed for the second emergency device;
   identify, as a replenishable device, a plurality of component supply devices that is allowed to be replenished with the component storage member based on a supply state of a component in each of the plurality of component supply devices; and
   extract a replenishment target device that is a target of the component replenishment work within a range of the emergency time zone among the plurality of replenishable devices.

2. The component replenishment management system according to claim 1, wherein the processor is configured to set a movement route of an operator who performs the component replenishment work, the movement route having a start point at a first emergency work area, which is the work area in which the first emergency device is disposed, and an end point at a second emergency work area, which is the work area in which the second emergency device is disposed.

3. A component mounting system comprising:
   a component mounting line in which a plurality of component mounters for mounting a component on a substrate to produce a component mounting substrate are connected; and
   the component replenishment management system according to claim 1 that manages component replenishment work for replenishing a plurality of component supply devices provided side by side in a work area set to each of the plurality of component mounters with a component storage member.

4. A component replenishment management system including a processor that performs processing to manage, in a component mounting line in which a plurality of component mounters for mounting a component on a substrate to produce a component mounting substrate are connected, component replenishment work for replenishing a plurality of component supply devices provided side by side in a work area set to each of the plurality of component mounters with a component storage member, the processor configured to:
   extract, as a first emergency device and a second emergency device, a top two component supply devices having a highest degree of emergency for performing the component replenishment work based on a component replenishment time limit that is set for each of the plurality of component supply devices in each of the work areas, the component replenishment time limit being time until the component replenishment work is required to be performed;

set, as an emergency time zone, a time zone from a first emergency time at which the component replenishment work is to be performed for the first emergency device to a second emergency time at which the component replenishment work is to be performed for the second emergency device;

identify, as a replenishable device, a plurality of component supply devices that is allowed to be replenished with the component storage member based on a supply state of a component in each of the plurality of component supply devices; and extract a replenishment target device that is a target of the component replenishment work within a range of the emergency time zone among the plurality of replenishable devices, wherein the processor is further configured to:

set a movement route of an operator who performs the component replenishment work, the movement route having a start point at a first emergency work area, which is the work area in which the first emergency device is disposed, and an end point at a second emergency work area, which is the work area in which the second emergency device is disposed, extract the replenishment target devices for which the component replenishment work is allowed to be performed within a range of the emergency time zone as many as possible based on work standard time required from start to end of the component replenishment work, and set, as the movement route, a route that passes through all of the work areas where the replenishment target device extracted by the replenishment target extraction unit is disposed between the start point and the end point.

5. The component replenishment management system according to claim 4, wherein the processor is configured to extract the replenishment target devices in descending order of priority of performing the component replenishment work based on the component replenishment time limit.

6. A component mounting system comprising:

a component mounting line in which a plurality of component mounters for mounting a component on a substrate to produce a component mounting substrate are connected; and the component replenishment management system according to claim 4 that manages component replenishment work for replenishing a plurality of component supply devices provided side by side in a work area set to each of the plurality of component mounters with a component storage member.

7. A component replenishment management system including a processor that performs processing to manage, in a component mounting line in which a plurality of component mounters for mounting a component on a substrate to produce a component mounting substrate are connected, component replenishment work for replenishing a plurality of component supply devices provided side by side in a work area set to each of the plurality of component mounters with a component storage member, the processor configured to:

extract, as a first emergency device and a second emergency device, a top two component supply devices having a highest degree of emergency for performing the component replenishment work based on a component replenishment time limit that is set for each of the plurality of component supply devices in each of the work areas, the component replenishment time limit being time until the component replenishment work is required to be performed;

set, as an emergency time zone, a time zone from a first emergency time at which the component replenishment work is to be performed for the first emergency device to a second emergency time at which the component replenishment work is to be performed for the second emergency device;

identify, as a replenishable device, a plurality of component supply devices that is allowed to be replenished with the component storage member based on a supply state of a component in each of the plurality of component supply devices; and extract a replenishment target device that is a target of the component replenishment work within a range of the emergency time zone among the plurality of replenishable devices, wherein a plurality of the component mounting lines are provided side by side, and the processor is further configured to:

set a movement route of an operator who performs the component replenishment work, the movement route having a start point at a first emergency work area, which is the work area in which the first emergency device is disposed, and an end point at a second emergency work area, which is the work area in which the second emergency device is disposed, in a case where a non-emergency target line exists, the non-emergency target line being the component mounting line that does not include the component mounter in which the first emergency work area and the second emergency work area are set, set, as the movement route, a route that is continuous in a single stroke without an intersection, the route not passing through the non-emergency target line and including a straight route portion extending along the component mounting line between the start point and the end point, and extract, as the replenishment target device, a replenishable device disposed in the work area on the movement route among the plurality of replenishable devices.

8. The component replenishment management system according to claim 7, wherein in a case where a non-work target area exists, the non-work target area being an area in which the replenishable device is not disposed in each of the work areas and which is excluded from a target of the component replenishment work, the processor is configured to set, as the movement route, a route that does not pass through the non-work target area within a range in which the route is allowed to be provided in a single stroke without an intersection.

9. The component replenishment management system according to claim 8, wherein the processor is configured to set, as the movement route, a route having a largest number of the replenishable devices within a range in which the route is allowed to be provided in a single stroke without an intersection.

10. The component replenishment management system according to claim 8, wherein the processor is configured to set, as the movement route, a route having a shortest route length.

11. A component mounting system comprising:
a component mounting line in which a plurality of component mounters for mounting a component on a substrate to produce a component mounting substrate are connected; and
the component replenishment management system according to claim 7 that manages component replenishment work for replenishing a plurality of component supply devices provided side by side in a work area set to each of the plurality of component mounters with a component storage member.

12. A component replenishment management system including a processor that performs processing to manage, in a component mounting line in which a plurality of component mounters for mounting a component on a substrate to produce a component mounting substrate are connected, component replenishment work for replenishing a plurality of component supply devices provided side by side in a work area set to each of the plurality of component mounters with a component storage member, the processor configured to:
  extract, as an emergency device, a component supply device for which the component replenishment work is to be performed urgently based on a component replenishment time limit that is set for each of the plurality of component supply devices in each of the work areas, the component replenishment time limit being time until the component replenishment work is required to be performed;
  set an emergency time zone from a predetermined time to an emergency time at which the component replenishment work is to be performed for the emergency device;
  identify, as a replenishable device, a plurality of component supply devices that is allowed to be replenished with the component storage member based on a supply state of a component in each of the plurality of component supply devices; and
  extract a replenishment target device that is a target of the component replenishment work within a range of the emergency time zone among the plurality of replenishable devices, wherein the component supply device includes a component supply device in a first replenishment system and a component supply device in a second replenishment system which have different systems of replenishment with the component storage member,
the component supply device in the first replenishment system is a device capable of mounting a plurality of the component storage members and for which the component replenishment work is allowed to be performed with a component storage member for replenishment in a state where a preceding component storage member for which component supply is performed first runs out of a component and component supply from a subsequent component storage member is allowed to be performed,
the component supply device in the second replenishment system is a device for which splicing work for joining a front end portion of a component storage tape for replenishment to a rear end portion of a component storage tape as the component storage member needs to be performed as the component replenishment work immediately before the component storage tape runs out of a component, and
the emergency device is the component supply device in the second replenishment system.

13. A component mounting system comprising:
a component mounting line in which a plurality of component mounters for mounting a component on a substrate to produce a component mounting substrate are connected; and
the component replenishment management system according to claim 12 that manages component replenishment work for replenishing a plurality of component supply devices provided side by side in a work area set to each of the plurality of component mounters with a component storage member.

* * * * *